United States Patent
Hong et al.

(10) Patent No.: US 9,018,108 B2
(45) Date of Patent: Apr. 28, 2015

(54) LOW SHRINKAGE DIELECTRIC FILMS

(71) Applicant: Applied Materials, Inc., Santa Clara, CA (US)

(72) Inventors: Sukwon Hong, Watervliet, NY (US); Toan Tran, San Jose, CA (US); Abhijit Mallick, Palo Alto, CA (US); Jingmei Liang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/834,333

(22) Filed: Mar. 15, 2013

(65) Prior Publication Data
US 2014/0213070 A1    Jul. 31, 2014

Related U.S. Application Data

(60) Provisional application No. 61/756,762, filed on Jan. 25, 2013.

(51) Int. Cl.
*H01L 21/31*    (2006.01)
*H01L 21/02*    (2006.01)
(Continued)

(52) U.S. Cl.
CPC .... *H01L 21/02274* (2013.01); *H01L 21/02164* (2013.01); *C23C 16/56* (2013.01); *H01L 21/0217* (2013.01); *C23C 16/452* (2013.01);
(Continued)

(58) Field of Classification Search
CPC ............. H01L 21/02164; H01L 21/02326; H01L 21/02337; H01L 21/0217; H01L 21/02274; C23C 16/56; C23C 16/452; C23C 16/401; C23C 16/345

USPC ........... 438/787, 788, 778, 792; 257/E21.278
See application file for complete search history.

(56) References Cited

U.S. PATENT DOCUMENTS 2,861,009 A    11/1958  Rubner
2,889,704 A    8/1959   Pekarek
(Continued)

FOREIGN PATENT DOCUMENTS

CN    1830072 A    9/2006
DE    19654737 A1    7/1997
(Continued)

OTHER PUBLICATIONS

U.S. Appl. No. 12/050,373 filed Mar. 18, 2008, Stowell et al.
(Continued)

*Primary Examiner* — Michael Trinh
(74) *Attorney, Agent, or Firm* — Kilpatrick Townsend & Stockton

(57) ABSTRACT

Methods of forming a dielectric layer on a substrate are described, and may include introducing a first precursor into a remote plasma region fluidly coupled with a substrate processing region of a substrate processing chamber A plasma may be formed in the remote plasma region to produce plasma effluents. The plasma effluents may be directed into the substrate processing region. A silicon-containing precursor may be introduced into the substrate processing region, and the silicon-containing precursor may include at least one silicon-silicon bond. The plasma effluents and silicon-containing precursor may be reacted in the processing region to form a silicon-based dielectric layer that is initially flowable when formed on the substrate.

20 Claims, 5 Drawing Sheets

(51) Int. Cl.
*C23C 16/56* (2006.01)
*C23C 16/452* (2006.01)
*C23C 16/34* (2006.01)

(52) U.S. Cl.
CPC ........ *C23C 16/345* (2013.01); *H01L 21/02326* (2013.01); *H01L 21/02337* (2013.01)

(56) References Cited

U.S. PATENT DOCUMENTS

| | | |
|---|---|---|
| 3,046,177 A | 7/1962 | Hankins |
| 3,048,888 A | 8/1962 | Shockley et al. |
| 3,109,703 A | 11/1963 | Politzer et al. |
| 3,142,714 A | 7/1964 | Politzer et al. |
| 3,166,454 A | 1/1965 | Voelker |
| 3,451,840 A | 6/1969 | Hough |
| 3,720,784 A | 3/1973 | Maydan et al. |
| 3,806,223 A | 4/1974 | Keck et al. |
| RE28,375 E | 3/1975 | Maydan et al. |
| 3,999,918 A | 12/1976 | Landsman |
| 4,147,571 A | 4/1979 | Stringfellow et al. |
| 4,151,008 A | 4/1979 | Kirkpatrick |
| 4,185,252 A | 1/1980 | Gerlach |
| 4,200,666 A | 4/1980 | Reinberg |
| 4,212,663 A | 7/1980 | Aslami |
| 4,233,537 A | 11/1980 | Limpaecher |
| 4,297,162 A | 10/1981 | Mundt et al. |
| 4,309,225 A | 1/1982 | Fan et al. |
| 4,351,658 A | 9/1982 | Olshansky |
| 4,374,158 A | 2/1983 | Taniguchi et al. |
| 4,378,987 A | 4/1983 | Miller et al. |
| 4,385,802 A | 5/1983 | Blaszyk et al. |
| 4,402,571 A | 9/1983 | Cowan et al. |
| 4,425,146 A | 1/1984 | Izawa et al. |
| 4,425,907 A | 1/1984 | Younghouse |
| 4,468,413 A | 8/1984 | Bachmann |
| 4,469,551 A | 9/1984 | Laude |
| 4,496,216 A | 1/1985 | Cowan |
| 4,507,588 A | 3/1985 | Asmussen et al. |
| 4,511,520 A | 4/1985 | Bowen |
| 4,520,472 A | 5/1985 | Reno |
| 4,521,447 A | 6/1985 | Ovshinsky et al. |
| 4,525,733 A | 6/1985 | Losee |
| 4,528,009 A | 7/1985 | Sarkar |
| 4,545,646 A | 10/1985 | Chern et al. |
| 4,557,561 A | 12/1985 | Schneider et al. |
| 4,565,157 A | 1/1986 | Brors |
| 4,566,403 A | 1/1986 | Fournier |
| 4,568,631 A | 2/1986 | Badami et al. |
| 4,571,819 A | 2/1986 | Rogers et al. |
| 4,572,841 A | 2/1986 | Kaganowicz et al. |
| 4,590,042 A | 5/1986 | Drage |
| 4,619,680 A | 10/1986 | Nourshargh et al. |
| 4,656,052 A | 4/1987 | Satou et al. |
| 4,690,746 A | 9/1987 | McInerney et al. |
| 4,690,830 A | 9/1987 | Dickson et al. |
| 4,704,367 A | 11/1987 | Alvis et al. |
| 4,715,921 A | 12/1987 | Maher et al. |
| 4,732,761 A | 3/1988 | Machida et al. |
| 4,734,345 A | 3/1988 | Nomura et al. |
| 4,737,379 A | 4/1988 | Hudgens et al. |
| 4,738,748 A | 4/1988 | Kisa |
| 4,747,367 A | 5/1988 | Posa |
| 4,762,808 A | 8/1988 | Sharp et al. |
| 4,792,378 A | 12/1988 | Rose et al. |
| 4,808,258 A | 2/1989 | Otsubo et al. |
| 4,816,098 A | 3/1989 | Davis et al. |
| 4,818,326 A | 4/1989 | Liu et al. |
| 4,830,705 A | 5/1989 | Loewenstein et al. |
| 4,830,890 A | 5/1989 | Kanai |
| 4,834,831 A | 5/1989 | Nishizawa et al. |
| 4,835,005 A | 5/1989 | Hirooka et al. |
| 4,844,945 A | 7/1989 | Bhaskar et al. |
| 4,848,400 A | 7/1989 | Grant et al. |
| 4,848,902 A | 7/1989 | Schickle et al. |
| 4,851,370 A | 7/1989 | Doklan et al. |
| 4,854,263 A | 8/1989 | Chang et al. |
| 4,856,859 A | 8/1989 | Imoto |
| 4,868,005 A | 9/1989 | Ehrlich et al. |
| 4,872,947 A | 10/1989 | Wang et al. |
| 4,877,757 A | 10/1989 | York et al. |
| 4,878,994 A | 11/1989 | Jucha et al. |
| 4,885,471 A | 12/1989 | Telfair et al. |
| 4,890,575 A | 1/1990 | Ito et al. |
| 4,892,753 A | 1/1990 | Wang et al. |
| 4,894,352 A | 1/1990 | Lane et al. |
| 4,898,557 A | 2/1990 | Engemann |
| 4,910,043 A | 3/1990 | Freeman et al. |
| 4,927,704 A | 5/1990 | Reed et al. |
| 4,931,354 A | 6/1990 | Wakino et al. |
| 4,932,749 A | 6/1990 | Haidle et al. |
| 4,946,593 A | 8/1990 | Pinigis |
| 4,951,601 A | 8/1990 | Maydan et al. |
| 4,953,498 A | 9/1990 | Hashizume et al. |
| 4,960,488 A | 10/1990 | Law et al. |
| 4,962,063 A | 10/1990 | Maydan et al. |
| 4,989,541 A | 2/1991 | Mikoshiba et al. |
| 4,990,374 A | 2/1991 | Keeley et al. |
| 5,000,113 A | 3/1991 | Wang et al. |
| 5,003,178 A | 3/1991 | Livesay |
| 5,006,218 A | 4/1991 | Yoshida et al. |
| 5,013,691 A | 5/1991 | Lory et al. |
| 5,016,332 A | 5/1991 | Reichelderfer et al. |
| 5,032,435 A | 7/1991 | Biefeld et al. |
| 5,051,380 A | 9/1991 | Maeda et al. |
| 5,059,231 A | 10/1991 | Ackermann et al. |
| 5,078,922 A | 1/1992 | Collins et al. |
| 5,081,069 A | 1/1992 | Parker et al. |
| 5,089,442 A | 2/1992 | Olmer |
| 5,093,149 A | 3/1992 | Doehler et al. |
| 5,110,407 A | 5/1992 | Ono et al. |
| 5,112,439 A | 5/1992 | Reisman et al. |
| 5,124,014 A | 6/1992 | Foo et al. |
| 5,125,360 A | 6/1992 | Nakayama et al. |
| 5,133,986 A | 7/1992 | Blum et al. |
| 5,142,385 A | 8/1992 | Anderson et al. |
| 5,148,714 A | 9/1992 | McDiarmid |
| 5,149,375 A | 9/1992 | Matsuyama |
| 5,156,881 A | 10/1992 | Okano et al. |
| 5,160,408 A | 11/1992 | Long |
| 5,167,558 A | 12/1992 | Duchek et al. |
| 5,178,739 A | 1/1993 | Barnes et al. |
| 5,186,120 A | 2/1993 | Ohnishi et al. |
| 5,204,288 A | 4/1993 | Marks et al. |
| 5,204,314 A | 4/1993 | Kirlin et al. |
| 5,212,119 A | 5/1993 | Hah et al. |
| 5,215,787 A | 6/1993 | Homma |
| 5,236,562 A | 8/1993 | Okumura et al. |
| 5,242,530 A | 9/1993 | Batey et al. |
| 5,242,561 A | 9/1993 | Sato |
| 5,242,566 A | 9/1993 | Parker |
| 5,244,841 A | 9/1993 | Marks et al. |
| 5,246,744 A | 9/1993 | Matsuda et al. |
| 5,252,178 A | 10/1993 | Moslehi |
| 5,253,319 A | 10/1993 | Bhagavatula |
| 5,264,040 A | 11/1993 | Geyling |
| 5,266,502 A | 11/1993 | Okada et al. |
| 5,269,847 A | 12/1993 | Anderson et al. |
| 5,270,125 A | 12/1993 | America et al. |
| 5,270,264 A | 12/1993 | Andideh et al. |
| 5,271,972 A | 12/1993 | Kwok et al. |
| 5,273,930 A | 12/1993 | Steele et al. |
| 5,275,977 A | 1/1994 | Otsubo et al. |
| 5,279,784 A | 1/1994 | Bender et al. |
| 5,279,865 A | 1/1994 | Chebi et al. |
| 5,288,518 A | 2/1994 | Homma |
| 5,290,993 A | 3/1994 | Kaji et al. |
| 5,294,285 A | 3/1994 | Masahiro et al. |
| 5,294,286 A | 3/1994 | Nishizawa et al. |
| 5,295,220 A | 3/1994 | Heming et al. |
| 5,298,365 A | 3/1994 | Okamoto et al. |
| 5,302,233 A | 4/1994 | Kim et al. |
| 5,302,555 A | 4/1994 | Yu |
| 5,304,250 A | 4/1994 | Sameshima et al. |

(56) References Cited

U.S. PATENT DOCUMENTS

| | | | |
|---|---|---|---|
| 5,304,277 | A | 4/1994 | Ohara et al. |
| 5,304,279 | A | 4/1994 | Coultas et al. |
| 5,306,530 | A | 4/1994 | Strongin et al. |
| 5,314,724 | A | 5/1994 | Tsukune et al. |
| 5,314,845 | A | 5/1994 | Lee et al. |
| 5,316,804 | A | 5/1994 | Tomikawa et al. |
| 5,317,900 | A | 6/1994 | Bergquist |
| 5,319,247 | A | 6/1994 | Matsuura |
| 5,323,269 | A | 6/1994 | Walker et al. |
| 5,326,725 | A | 7/1994 | Sherstinsky et al. |
| 5,328,558 | A | 7/1994 | Kawamura |
| 5,334,552 | A | 8/1994 | Homma |
| 5,345,079 | A | 9/1994 | French et al. |
| 5,348,774 | A | 9/1994 | Golecki et al. |
| 5,356,722 | A | 10/1994 | Nguyen et al. |
| 5,357,365 | A | 10/1994 | Ipposhi et al. |
| 5,362,526 | A | 11/1994 | Wang et al. |
| 5,364,488 | A | 11/1994 | Minato et al. |
| 5,365,057 | A | 11/1994 | Morley et al. |
| 5,369,464 | A | 11/1994 | Kamon |
| 5,369,722 | A | 11/1994 | Heming et al. |
| 5,372,860 | A | 12/1994 | Fehlner et al. |
| 5,374,570 | A | 12/1994 | Nasu et al. |
| 5,384,008 | A | 1/1995 | Sinha et al. |
| 5,385,763 | A | 1/1995 | Okano et al. |
| 5,387,288 | A | 2/1995 | Shatas |
| 5,393,708 | A | 2/1995 | Hsia et al. |
| 5,399,529 | A | 3/1995 | Homma |
| 5,401,350 | A | 3/1995 | Patrick et al. |
| 5,403,434 | A | 4/1995 | Moslehi |
| 5,408,569 | A | 4/1995 | Nishimoto |
| 5,412,180 | A | 5/1995 | Coombs |
| 5,413,967 | A | 5/1995 | Matsuda et al. |
| 5,415,835 | A | 5/1995 | Brueck et al. |
| 5,416,048 | A | 5/1995 | Blalock et al. |
| 5,420,075 | A | 5/1995 | Homma et al. |
| 5,426,076 | A | 6/1995 | Moghadam |
| 5,429,995 | A | 7/1995 | Nishiyama et al. |
| 5,434,109 | A | 7/1995 | Geissler et al. |
| 5,434,434 | A | 7/1995 | Kasahara et al. |
| 5,439,524 | A | 8/1995 | Cain et al. |
| 5,443,647 | A | 8/1995 | Aucoin et al. |
| 5,447,570 | A | 9/1995 | Schmitz et al. |
| 5,459,565 | A | 10/1995 | Aharon et al. |
| 5,463,534 | A | 10/1995 | Raven |
| 5,468,342 | A | 11/1995 | Nulty et al. |
| 5,468,595 | A | 11/1995 | Livesay |
| 5,468,687 | A | 11/1995 | Carl et al. |
| 5,469,806 | A | 11/1995 | Mochizuki et al. |
| 5,474,589 | A | 12/1995 | Ohga et al. |
| 5,474,955 | A | 12/1995 | Thakur |
| 5,480,687 | A | 1/1996 | Heming et al. |
| 5,480,818 | A | 1/1996 | Matsumoto et al. |
| 5,483,920 | A | 1/1996 | Pryor |
| 5,484,749 | A | 1/1996 | Maeda et al. |
| 5,485,420 | A | 1/1996 | Lage et al. |
| 5,492,858 | A | 2/1996 | Bose et al. |
| 5,494,523 | A | 2/1996 | Steger et al. |
| 5,503,875 | A | 4/1996 | Imai et al. |
| 5,507,881 | A | 4/1996 | Sichanugrist et al. |
| 5,508,067 | A | 4/1996 | Sato et al. |
| 5,518,805 | A | 5/1996 | Ho et al. |
| 5,521,126 | A | 5/1996 | Okamura et al. |
| 5,522,957 | A | 6/1996 | Weling et al. |
| 5,525,550 | A | 6/1996 | Kato |
| 5,527,391 | A | 6/1996 | Echizen et al. |
| 5,527,733 | A | 6/1996 | Nishizawa et al. |
| 5,529,630 | A | 6/1996 | Imahashi et al. |
| 5,530,293 | A | 6/1996 | Cohen et al. |
| 5,534,070 | A | 7/1996 | Okamura et al. |
| 5,534,072 | A | 7/1996 | Mizuno et al. |
| 5,536,323 | A | 7/1996 | Kirlin et al. |
| 5,536,360 | A | 7/1996 | Nguyen et al. |
| 5,547,703 | A | 8/1996 | Camilletti et al. |
| 5,558,717 | A | 9/1996 | Zhao et al. |
| 5,562,952 | A | 10/1996 | Nakahigashi et al. |
| 5,563,105 | A | 10/1996 | Dobuzinsky et al. |
| 5,567,267 | A | 10/1996 | Kazama et al. |
| 5,569,350 | A | 10/1996 | Osada et al. |
| 5,571,576 | A | 11/1996 | Qian et al. |
| 5,578,532 | A | 11/1996 | van de Ven et al. |
| 5,587,014 | A | 12/1996 | Iyechika et al. |
| 5,589,002 | A | 12/1996 | Su |
| 5,589,233 | A | 12/1996 | Law et al. |
| 5,593,741 | A | 1/1997 | Ikeda |
| 5,597,439 | A | 1/1997 | Salzman |
| 5,599,740 | A | 2/1997 | Jang et al. |
| 5,604,151 | A | 2/1997 | Goela et al. |
| 5,607,725 | A | 3/1997 | Goodman |
| 5,612,251 | A | 3/1997 | Lee |
| 5,614,055 | A | 3/1997 | Fairbairn et al. |
| 5,620,525 | A | 4/1997 | van de Ven et al. |
| 5,621,241 | A | 4/1997 | Jain |
| 5,621,497 | A | 4/1997 | Terasawa et al. |
| 5,622,784 | A | 4/1997 | Okaue et al. |
| 5,624,582 | A | 4/1997 | Cain |
| 5,626,922 | A | 5/1997 | Miyanaga et al. |
| 5,629,043 | A | 5/1997 | Inaba et al. |
| 5,629,217 | A | 5/1997 | Miwa et al. |
| 5,630,881 | A | 5/1997 | Ogure et al. |
| 5,635,409 | A | 6/1997 | Moslehi |
| 5,641,581 | A | 6/1997 | Nishiyama et al. |
| 5,643,638 | A | 7/1997 | Otto et al. |
| 5,645,645 | A | 7/1997 | Zhang et al. |
| 5,648,175 | A | 7/1997 | Russell et al. |
| 5,660,472 | A | 8/1997 | Peuse et al. |
| 5,661,093 | A | 8/1997 | Ravi et al. |
| 5,665,167 | A | 9/1997 | Deguchi et al. |
| 5,665,643 | A | 9/1997 | Shin |
| 5,669,975 | A | 9/1997 | Ashtiani |
| 5,672,211 | A | 9/1997 | Mai et al. |
| 5,672,861 | A | 9/1997 | Fairley et al. |
| 5,674,304 | A | 10/1997 | Fukada et al. |
| 5,679,606 | A | 10/1997 | Wang et al. |
| 5,683,518 | A | 11/1997 | Moore et al. |
| 5,686,734 | A | 11/1997 | Hamakawa et al. |
| 5,688,357 | A | 11/1997 | Hanawa |
| 5,688,382 | A | 11/1997 | Besen et al. |
| 5,691,009 | A | 11/1997 | Sandhu |
| 5,693,139 | A | 12/1997 | Nishizawa et al. |
| 5,702,532 | A | 12/1997 | Wen et al. |
| 5,705,321 | A | 1/1998 | Brueck et al. |
| 5,709,757 | A | 1/1998 | Hatano et al. |
| 5,710,079 | A | 1/1998 | Sukharev |
| 5,711,816 | A | 1/1998 | Kirlin et al. |
| 5,712,185 | A | 1/1998 | Tsai et al. |
| 5,719,085 | A | 2/1998 | Moon et al. |
| 5,728,223 | A | 3/1998 | Murakami et al. |
| 5,728,260 | A | 3/1998 | Brown et al. |
| 5,728,631 | A | 3/1998 | Wang |
| 5,736,423 | A | 4/1998 | Ngo |
| 5,739,898 | A | 4/1998 | Ozawa et al. |
| 5,749,966 | A | 5/1998 | Shates |
| 5,753,044 | A | 5/1998 | Hanawa et al. |
| 5,755,859 | A | 5/1998 | Brusic et al. |
| 5,756,400 | A | 5/1998 | Ye et al. |
| 5,759,744 | A | 6/1998 | Brueck et al. |
| 5,766,360 | A | 6/1998 | Sato et al. |
| 5,766,365 | A | 6/1998 | Umotoy et al. |
| 5,767,628 | A | 6/1998 | Keller et al. |
| 5,769,951 | A | 6/1998 | van de Ven et al. |
| 5,770,100 | A | 6/1998 | Fukuyama et al. |
| 5,776,557 | A | 7/1998 | Okano et al. |
| 5,782,980 | A | 7/1998 | Allen et al. |
| 5,786,039 | A | 7/1998 | Brouquet |
| 5,786,263 | A | 7/1998 | Perera |
| 5,789,322 | A | 8/1998 | Brown et al. |
| 5,792,261 | A | 8/1998 | Hama et al. |
| 5,792,272 | A | 8/1998 | Van Os et al. |
| 5,796,116 | A | 8/1998 | Nakata et al. |
| 5,804,259 | A | 9/1998 | Robles |
| 5,807,785 | A | 9/1998 | Ravi |
| 5,807,792 | A | 9/1998 | Ilg et al. |
| 5,811,325 | A | 9/1998 | Lin et al. |

(56) References Cited

U.S. PATENT DOCUMENTS

| | | |
|---|---|---|
| 5,811,356 A | 9/1998 | Murugesh et al. |
| 5,812,403 A | 9/1998 | Fong et al. |
| 5,817,562 A | 10/1998 | Chang et al. |
| 5,822,479 A | 10/1998 | Napier et al. |
| 5,824,375 A | 10/1998 | Gupta |
| 5,835,677 A | 11/1998 | Li et al. |
| 5,840,631 A | 11/1998 | Kubo et al. |
| 5,843,233 A | 12/1998 | van de Ven et al. |
| 5,843,837 A | 12/1998 | Baek et al. |
| 5,844,684 A | 12/1998 | Maris et al. |
| 5,849,092 A | 12/1998 | Xi et al. |
| 5,849,455 A | 12/1998 | Ueda et al. |
| 5,850,105 A | 12/1998 | Dawson et al. |
| 5,853,607 A | 12/1998 | Zhao et al. |
| 5,855,681 A | 1/1999 | Maydan et al. |
| 5,858,876 A | 1/1999 | Chew |
| RE36,113 E | 2/1999 | Brueck et al. |
| 5,869,149 A | 2/1999 | Denison et al. |
| 5,872,052 A | 2/1999 | Iyer |
| 5,872,058 A | 2/1999 | Van Cleemput et al. |
| 5,874,350 A | 2/1999 | Nakagawa |
| 5,876,503 A | 3/1999 | Roeder et al. |
| 5,882,414 A | 3/1999 | Fong et al. |
| 5,882,417 A | 3/1999 | van de Ven et al. |
| 5,886,864 A | 3/1999 | Dvorsky |
| 5,888,304 A | 3/1999 | Umotoy et al. |
| 5,888,591 A | 3/1999 | Gleason |
| 5,897,751 A | 4/1999 | Makowiecki |
| 5,900,699 A | 5/1999 | Samukawa et al. |
| 5,902,134 A | 5/1999 | Egashira |
| 5,902,407 A | 5/1999 | deBoer et al. |
| 5,903,106 A | 5/1999 | Young et al. |
| 5,904,491 A | 5/1999 | Ojha et al. |
| 5,906,680 A | 5/1999 | Meyerson |
| 5,907,435 A | 5/1999 | Ang |
| 5,910,342 A | 6/1999 | Hirooka et al. |
| 5,911,834 A | 6/1999 | Fairbairn et al. |
| 5,913,140 A | 6/1999 | Roche et al. |
| 5,915,190 A | 6/1999 | Pirkle |
| 5,916,365 A | 6/1999 | Sherman et al. |
| 5,920,792 A | 7/1999 | Lin |
| 5,922,617 A | 7/1999 | Wang et al. |
| 5,925,189 A | 7/1999 | Nguyen et al. |
| 5,925,411 A | 7/1999 | van de Ven et al. |
| 5,926,722 A | 7/1999 | Jang et al. |
| 5,926,737 A | 7/1999 | Ameen et al. |
| 5,932,283 A | 8/1999 | Kaneyama |
| 5,935,283 A | 8/1999 | Sweeney et al. |
| 5,935,340 A | 8/1999 | Xia et al. |
| 5,937,308 A | 8/1999 | Gardner et al. |
| 5,937,323 A | 8/1999 | Orczyk et al. |
| 5,939,763 A | 8/1999 | Hao et al. |
| 5,939,831 A | 8/1999 | Fong et al. |
| 5,944,049 A | 8/1999 | Beyer et al. |
| 5,944,902 A | 8/1999 | Redeker et al. |
| 5,946,592 A | 8/1999 | Lin |
| 5,953,635 A | 9/1999 | Andideh |
| 5,961,850 A | 10/1999 | Satou et al. |
| 5,965,203 A | 10/1999 | Gabric et al. |
| 5,965,246 A | 10/1999 | Guiselin et al. |
| 5,966,499 A | 10/1999 | Hinkle et al. |
| 5,966,595 A | 10/1999 | Thakur et al. |
| 5,968,587 A | 10/1999 | Frankel |
| 5,968,610 A | 10/1999 | Liu et al. |
| 5,969,409 A | 10/1999 | Lin |
| 5,970,383 A | 10/1999 | Lee |
| 5,976,257 A | 11/1999 | Kanai et al. |
| 5,976,261 A | 11/1999 | Moslehi et al. |
| 5,976,327 A | 11/1999 | Tanaka |
| 5,980,686 A | 11/1999 | Goto |
| 5,981,354 A | 11/1999 | Spikes et al. |
| 5,985,102 A | 11/1999 | Leiphart |
| 5,986,234 A | 11/1999 | Matthews et al. |
| 5,990,000 A | 11/1999 | Hong et al. |
| 5,990,013 A | 11/1999 | Berenguer et al. |
| 5,990,984 A | 11/1999 | Meredith et al. |
| 6,001,175 A | 12/1999 | Maruyama et al. |
| 6,004,831 A | 12/1999 | Yamazaki et al. |
| 6,008,515 A | 12/1999 | Hsia et al. |
| 6,009,827 A | 1/2000 | Robles |
| 6,009,830 A | 1/2000 | Li et al. |
| 6,013,191 A | 1/2000 | Nasser-Faili et al. |
| 6,013,584 A | 1/2000 | M'Saad |
| 6,014,979 A | 1/2000 | Van Autryve et al. |
| 6,017,791 A | 1/2000 | Wang et al. |
| 6,019,839 A | 2/2000 | Achutharaman et al. |
| 6,020,035 A | 2/2000 | Gupta et al. |
| 6,021,785 A | 2/2000 | Grutzediek et al. |
| 6,024,044 A | 2/2000 | Law et al. |
| 6,024,799 A | 2/2000 | Chen et al. |
| 6,025,627 A | 2/2000 | Forbes et al. |
| 6,026,053 A | 2/2000 | Satorius |
| 6,027,601 A | 2/2000 | Hanawa |
| 6,027,705 A | 2/2000 | Kitsuno et al. |
| 6,030,460 A | 2/2000 | Sukharev |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,040,022 A | 3/2000 | Chang et al. |
| 6,042,654 A | 3/2000 | Comita et al. |
| 6,042,901 A | 3/2000 | Denison et al. |
| 6,043,136 A | 3/2000 | Jang et al. |
| 6,050,506 A | 4/2000 | Guo et al. |
| 6,051,503 A | 4/2000 | Bhardwaj et al. |
| 6,054,739 A | 4/2000 | Yamazaki et al. |
| 6,057,242 A | 5/2000 | Kishimoto |
| 6,059,643 A | 5/2000 | Hu et al. |
| 6,061,077 A | 5/2000 | Kashiwaya et al. |
| 6,070,551 A | 6/2000 | Li et al. |
| 6,071,573 A | 6/2000 | Koemtzopoulos et al. |
| 6,074,696 A | 6/2000 | Sato |
| 6,074,959 A | 6/2000 | Wang et al. |
| 6,077,412 A | 6/2000 | Ting et al. |
| 6,077,764 A | 6/2000 | Sugiarto et al. |
| 6,077,786 A | 6/2000 | Chakravarti et al. |
| 6,079,353 A | 6/2000 | Leksell et al. |
| 6,079,356 A | 6/2000 | Umotoy et al. |
| 6,080,683 A | 6/2000 | Faur et al. |
| 6,080,965 A | 6/2000 | Osawa |
| 6,083,822 A | 7/2000 | Lee |
| 6,087,243 A | 7/2000 | Wang |
| 6,088,505 A | 7/2000 | Hobbs |
| 6,090,442 A | 7/2000 | Klaus et al. |
| 6,090,718 A | 7/2000 | Soga et al. |
| 6,090,723 A | 7/2000 | Thakur et al. |
| 6,095,085 A | 8/2000 | Agarwal |
| 6,095,643 A | 8/2000 | Cook et al. |
| 6,096,389 A | 8/2000 | Kanai |
| 6,096,646 A | 8/2000 | Lee et al. |
| 6,099,647 A | 8/2000 | Yieh et al. |
| 6,103,014 A | 8/2000 | Lei et al. |
| 6,106,663 A | 8/2000 | Kuthi et al. |
| 6,106,678 A | 8/2000 | Shufflebotham et al. |
| 6,109,065 A | 8/2000 | Atkins et al. |
| 6,110,838 A | 8/2000 | Loewenstein |
| 6,110,845 A | 8/2000 | Seguchi et al. |
| 6,114,219 A | 9/2000 | Spikes, Jr. et al. |
| 6,114,235 A | 9/2000 | Foote et al. |
| 6,114,253 A | 9/2000 | Jang et al. |
| 6,114,704 A | 9/2000 | Buck et al. |
| 6,117,772 A | 9/2000 | Murzin et al. |
| 6,121,130 A | 9/2000 | Chua et al. |
| 6,121,161 A | 9/2000 | Rossman et al. |
| 6,121,930 A | 9/2000 | Grangeat et al. |
| 6,122,934 A | 9/2000 | Narita et al. |
| 6,124,158 A | 9/2000 | Dautartas et al. |
| 6,125,859 A | 10/2000 | Kao et al. |
| 6,132,814 A | 10/2000 | Livesay et al. |
| 6,133,160 A | 10/2000 | Komiyama et al. |
| 6,136,680 A | 10/2000 | Lai et al. |
| 6,136,685 A | 10/2000 | Narwankar et al. |
| 6,140,242 A | 10/2000 | Oh et al. |
| 6,144,060 A | 11/2000 | Park et al. |

(56) References Cited

U.S. PATENT DOCUMENTS

| | | | |
|---|---|---|---|
| 6,146,970 A | 11/2000 | Witek et al. |
| 6,147,009 A | 11/2000 | Grill et al. |
| 6,148,761 A | 11/2000 | Majewski et al. |
| 6,149,730 A | 11/2000 | Matsubara et al. |
| 6,149,976 A | 11/2000 | Matsuki et al. |
| 6,149,986 A | 11/2000 | Shibata et al. |
| 6,149,987 A | 11/2000 | Perng et al. |
| 6,150,070 A | 11/2000 | Minter et al. |
| 6,150,209 A | 11/2000 | Sun et al. |
| 6,150,286 A | 11/2000 | Sun et al. |
| 6,151,446 A | 11/2000 | Hunter et al. |
| 6,153,269 A | 11/2000 | Gleason |
| 6,154,582 A | 11/2000 | Bazylenko et al. |
| 6,156,114 A | 12/2000 | Bell et al. |
| 6,156,394 A | 12/2000 | Schultz Yamasaki et al. |
| 6,156,435 A | 12/2000 | Gleason |
| 6,156,483 A | 12/2000 | McCoy et al. |
| 6,156,581 A | 12/2000 | Vaudo et al. |
| 6,158,852 A | 12/2000 | Nuttall et al. |
| 6,165,834 A | 12/2000 | Agarwal et al. |
| 6,167,834 B1 | 1/2001 | Wang et al. |
| 6,168,668 B1 | 1/2001 | Yudovsky |
| 6,170,428 B1 | 1/2001 | Redeker et al. |
| 6,171,901 B1 | 1/2001 | Blair et al. |
| 6,171,917 B1 | 1/2001 | Sun et al. |
| 6,174,808 B1 | 1/2001 | Jang et al. |
| 6,179,277 B1 | 1/2001 | Huston et al. |
| 6,179,925 B1 | 1/2001 | Schmitt et al. |
| 6,180,490 B1 | 1/2001 | Vassiliev et al. |
| 6,182,602 B1 | 2/2001 | Redeker et al. |
| 6,184,155 B1 | 2/2001 | Yu et al. |
| 6,184,158 B1 | 2/2001 | Shufflebotham et al. |
| 6,186,092 B1 | 2/2001 | Tsai et al. |
| 6,187,682 B1 | 2/2001 | Denning et al. |
| 6,189,483 B1 | 2/2001 | Ishikawa et al. |
| 6,190,233 B1 | 2/2001 | Hong et al. |
| 6,190,973 B1 | 2/2001 | Berg et al. |
| 6,191,004 B1 | 2/2001 | Hsiao |
| 6,191,026 B1 | 2/2001 | Rana et al. |
| 6,192,712 B1 | 2/2001 | Saito et al. |
| 6,194,037 B1 | 2/2001 | Terasaki et al. |
| 6,194,038 B1 | 2/2001 | Rossman |
| 6,195,246 B1 | 2/2001 | Livesay |
| 6,197,705 B1 | 3/2001 | Vassiliev |
| 6,200,412 B1 | 3/2001 | Kilgore et al. |
| 6,200,893 B1 | 3/2001 | Sneh et al. |
| 6,203,657 B1 | 3/2001 | Collison et al. |
| 6,203,863 B1 | 3/2001 | Liu et al. |
| 6,204,200 B1 | 3/2001 | Shieh et al. |
| 6,204,201 B1 | 3/2001 | Ross |
| 6,204,483 B1 | 3/2001 | Fair et al. |
| 6,206,972 B1 | 3/2001 | Dunham |
| 6,207,353 B1 | 3/2001 | Armacost et al. |
| 6,207,487 B1 | 3/2001 | Kim et al. |
| 6,207,555 B1 | 3/2001 | Ross |
| 6,207,587 B1 | 3/2001 | Li et al. |
| 6,211,040 B1 | 4/2001 | Liu et al. |
| 6,215,106 B1 | 4/2001 | Boas et al. |
| 6,217,658 B1 | 4/2001 | Orczyk et al. |
| 6,218,057 B1 | 4/2001 | Cirelli et al. |
| 6,218,090 B1 | 4/2001 | Minter et al. |
| 6,218,268 B1 | 4/2001 | Xia et al. |
| 6,221,791 B1 | 4/2001 | Wang et al. |
| 6,223,540 B1 | 5/2001 | Egermeier |
| 6,224,950 B1 | 5/2001 | Hirata |
| 6,228,751 B1 | 5/2001 | Yamazaki et al. |
| 6,230,650 B1 | 5/2001 | Yamazaki |
| 6,231,674 B1 | 5/2001 | Chen et al. |
| 6,232,196 B1 | 5/2001 | Raaijmakers et al. |
| 6,232,580 B1 | 5/2001 | Sandhu |
| 6,233,044 B1 | 5/2001 | Brueck et al. |
| 6,236,105 B1 | 5/2001 | Kariya |
| 6,238,527 B1 | 5/2001 | Sone et al. |
| 6,239,002 B1 | 5/2001 | Jang et al. |
| 6,239,044 B1 | 5/2001 | Kashiwagi et al. |
| 6,239,909 B1 | 5/2001 | Hayashi et al. |
| 6,240,874 B1 | 6/2001 | Pike |
| 6,242,292 B1 | 6/2001 | Yamazaki et al. |
| 6,245,192 B1 | 6/2001 | Lenz et al. |
| 6,245,689 B1 | 6/2001 | Hao et al. |
| 6,248,397 B1 | 6/2001 | Ye |
| 6,248,628 B1 | 6/2001 | Halliyal et al. |
| 6,252,665 B1 | 6/2001 | Williams et al. |
| 6,255,035 B1 | 7/2001 | Minter et al. |
| 6,255,038 B1 | 7/2001 | Hobbs |
| 6,255,207 B1 | 7/2001 | Jang et al. |
| 6,258,690 B1 | 7/2001 | Zenke |
| 6,261,374 B1 | 7/2001 | Bang et al. |
| 6,261,857 B1 | 7/2001 | Alam et al. |
| 6,267,074 B1 | 7/2001 | Okumura |
| 6,268,274 B1 | 7/2001 | Wang et al. |
| 6,268,297 B1 | 7/2001 | Nag et al. |
| 6,270,572 B1 | 8/2001 | Kim et al. |
| 6,270,859 B2 | 8/2001 | Zhao et al. |
| 6,271,146 B1 | 8/2001 | Ross |
| 6,274,058 B1 | 8/2001 | Rajagopalan et al. |
| 6,274,500 B1 | 8/2001 | Xuechun et al. |
| 6,276,072 B1 | 8/2001 | Morad et al. |
| 6,284,646 B1 | 9/2001 | Leem |
| 6,284,686 B1 | 9/2001 | Marlor |
| 6,287,962 B1 | 9/2001 | Lin |
| 6,287,965 B1 | 9/2001 | Kang et al. |
| 6,290,865 B1 | 9/2001 | Fu |
| 6,291,319 B1 | 9/2001 | Yu et al. |
| 6,291,367 B1 | 9/2001 | Kelkar |
| 6,296,255 B1 | 10/2001 | Hashimoto |
| 6,296,712 B1 | 10/2001 | Guo et al. |
| 6,302,964 B1 | 10/2001 | Umotoy et al. |
| 6,302,965 B1 | 10/2001 | Umotoy et al. |
| 6,304,318 B1 | 10/2001 | Matsumoto |
| 6,304,362 B1 | 10/2001 | Zheludev et al. |
| 6,305,314 B1 | 10/2001 | Sneh et al. |
| 6,305,531 B1 | 10/2001 | Sneh et al. |
| 6,306,265 B1 | 10/2001 | Fu et al. |
| 6,311,638 B1 | 11/2001 | Ishii et al. |
| 6,313,010 B1 | 11/2001 | Nag et al. |
| 6,319,655 B1 | 11/2001 | Wong et al. |
| 6,319,849 B1 | 11/2001 | Oda et al. |
| 6,323,457 B1 | 11/2001 | Jung |
| 6,326,064 B1 | 12/2001 | Denison et al. |
| 6,326,246 B1 | 12/2001 | Yamamoto |
| 6,326,248 B1 | 12/2001 | Ohtani et al. |
| 6,326,325 B1 | 12/2001 | Dawson-Elli et al. |
| 6,328,808 B1 | 12/2001 | Tsai et al. |
| 6,331,494 B1 | 12/2001 | Olson et al. |
| 6,332,470 B1 | 12/2001 | Fishkin et al. |
| 6,335,280 B1 | 1/2002 | Van der Jeugd |
| 6,335,288 B1 | 1/2002 | Kwan et al. |
| 6,337,256 B1 | 1/2002 | Shim |
| 6,337,467 B1 | 1/2002 | Sik |
| 6,339,997 B1 | 1/2002 | Nakagawa et al. |
| 6,340,417 B1 | 1/2002 | Krivokapic |
| 6,340,435 B1 | 1/2002 | Bjorkman et al. |
| 6,340,556 B1 | 1/2002 | Wong |
| 6,342,277 B1 | 1/2002 | Sherman |
| 6,344,892 B1 | 2/2002 | Sugita et al. |
| 6,345,642 B1 | 2/2002 | Yoshidome et al. |
| 6,346,302 B2 | 2/2002 | Kishimoto et al. |
| 6,348,389 B1 | 2/2002 | Chou et al. |
| 6,348,403 B1 | 2/2002 | Raina et al. |
| 6,348,410 B1 | 2/2002 | Ngo et al. |
| 6,348,420 B1 | 2/2002 | Raaijmakers et al. |
| 6,348,421 B1 | 2/2002 | Shu et al. |
| 6,349,887 B1 | 2/2002 | Pyo |
| 6,352,945 B1 | 3/2002 | Matsuki et al. |
| 6,355,108 B1 | 3/2002 | Won et al. |
| 6,355,571 B1 | 3/2002 | Huang et al. |
| 6,355,581 B1 | 3/2002 | Vassiliev et al. |
| 6,357,385 B1 | 3/2002 | Ohmi et al. |
| 6,358,323 B1 | 3/2002 | Schmitt et al. |
| 6,358,670 B1 | 3/2002 | Wong |
| 6,358,829 B2 | 3/2002 | Yoon et al. |
| 6,360,685 B1 | 3/2002 | Xia et al. |
| 6,365,518 B1 | 4/2002 | Lee et al. |

(56) References Cited

U.S. PATENT DOCUMENTS

| | | | |
|---|---|---|---|
| 6,365,870 | B1 | 4/2002 | Petring et al. |
| 6,368,948 | B1 | 4/2002 | Ngo et al. |
| 6,372,291 | B1 | 4/2002 | Hua et al. |
| 6,374,770 | B1 | 4/2002 | Lee et al. |
| 6,375,753 | B1 | 4/2002 | Tolia et al. |
| 6,376,806 | B2 | 4/2002 | Yoo |
| 6,383,896 | B1 | 5/2002 | Kirimura et al. |
| 6,383,954 | B1 | 5/2002 | Wang et al. |
| 6,383,955 | B1 | 5/2002 | Matsuki et al. |
| 6,384,437 | B1 | 5/2002 | Tee et al. |
| 6,387,207 | B1 | 5/2002 | Janakiraman et al. |
| 6,391,777 | B1 | 5/2002 | Chen et al. |
| 6,391,785 | B1 | 5/2002 | Satta et al. |
| 6,391,803 | B1 | 5/2002 | Kim et al. |
| 6,393,042 | B1 | 5/2002 | Tanaka |
| 6,393,043 | B1 | 5/2002 | Fuchs |
| 6,395,150 | B1 | 5/2002 | Van Cleemput et al. |
| 6,398,430 | B1 | 6/2002 | Jeoung et al. |
| 6,399,489 | B1 | 6/2002 | M'Saad et al. |
| 6,399,491 | B2 | 6/2002 | Jeon et al. |
| 6,399,520 | B1 | 6/2002 | Kawakami et al. |
| 6,402,126 | B2 | 6/2002 | Vaartstra et al. |
| 6,406,677 | B1 | 6/2002 | Carter et al. |
| 6,407,399 | B1 | 6/2002 | Livesay |
| 6,408,125 | B1 | 6/2002 | Akwani et al. |
| 6,409,839 | B1 | 6/2002 | Sun et al. |
| 6,410,457 | B1 | 6/2002 | M'Saad et al. |
| 6,410,463 | B1 | 6/2002 | Matsuki et al. |
| 6,413,583 | B1 | 7/2002 | Moghadam et al. |
| 6,413,871 | B2 | 7/2002 | M'Saad et al. |
| 6,413,886 | B1 | 7/2002 | Kersch et al. |
| 6,416,823 | B2 | 7/2002 | Li et al. |
| 6,418,960 | B1 | 7/2002 | Mintz et al. |
| 6,423,384 | B1 | 7/2002 | Khazeni et al. |
| 6,424,298 | B1 | 7/2002 | Nishikawa et al. |
| 6,426,015 | B1 | 7/2002 | Xia et al. |
| 6,426,127 | B1 | 7/2002 | Ross |
| 6,426,289 | B1 | 7/2002 | Farrar |
| 6,432,479 | B2 | 8/2002 | Chang et al. |
| 6,433,911 | B1 | 8/2002 | Chen et al. |
| 6,436,193 | B1 | 8/2002 | Kasai et al. |
| 6,441,491 | B1 | 8/2002 | Grill et al. |
| 6,444,039 | B1 | 9/2002 | Nguyen et al. |
| 6,444,551 | B1 | 9/2002 | Ku et al. |
| 6,447,651 | B1 | 9/2002 | Ishikawa et al. |
| 6,448,187 | B2 | 9/2002 | Yau et al. |
| 6,450,117 | B1 | 9/2002 | Murugesh et al. |
| 6,451,119 | B2 | 9/2002 | Sneh et al. |
| 6,451,686 | B1 | 9/2002 | Ngai et al. |
| 6,454,860 | B2 | 9/2002 | Metzner et al. |
| 6,458,718 | B1 | 10/2002 | Todd |
| 6,465,044 | B1 | 10/2002 | Jain et al. |
| 6,468,853 | B1 | 10/2002 | Balasubramanian et al. |
| 6,468,924 | B2 | 10/2002 | Lee et al. |
| 6,469,283 | B1 | 10/2002 | Burkhart et al. |
| 6,475,284 | B1 | 11/2002 | Moore et al. |
| 6,479,098 | B1 | 11/2002 | Yoo et al. |
| 6,479,405 | B2 | 11/2002 | Lee et al. |
| 6,482,688 | B2 | 11/2002 | Hu et al. |
| 6,486,437 | B2 | 11/2002 | Tanabe |
| 6,486,487 | B2 | 11/2002 | Tanabe |
| 6,489,225 | B1 | 12/2002 | Ross |
| 6,489,241 | B1 | 12/2002 | Thilderkvist et al. |
| 6,489,254 | B1 | 12/2002 | Kelkar et al. |
| 6,492,283 | B2 | 12/2002 | Raaijmakers et al. |
| 6,500,771 | B1 | 12/2002 | Vassiliev et al. |
| 6,503,557 | B1 | 1/2003 | Joret |
| 6,503,799 | B2 | 1/2003 | Horita et al. |
| 6,503,843 | B1 | 1/2003 | Xia et al. |
| 6,506,253 | B2 | 1/2003 | Sakuma |
| 6,508,879 | B1 | 1/2003 | Hashimoto |
| 6,509,283 | B1 | 1/2003 | Thomas |
| 6,511,539 | B1 | 1/2003 | Raaijmakers et al. |
| 6,511,718 | B1 | 1/2003 | Paz de Araujo et al. |
| 6,511,923 | B1 | 1/2003 | Wang et al. |
| 6,512,264 | B1 | 1/2003 | Ogle, Jr. et al. |
| 6,514,339 | B1 | 2/2003 | Jung |
| 6,522,433 | B2 | 2/2003 | Kelsey et al. |
| 6,524,931 | B1 | 2/2003 | Perera |
| 6,527,910 | B2 | 3/2003 | Rossman |
| 6,528,332 | B2 | 3/2003 | Mahanpour et al. |
| 6,528,412 | B1 | 3/2003 | Wang et al. |
| 6,531,193 | B2 | 3/2003 | Fonash et al. |
| 6,531,377 | B2 | 3/2003 | Knorr et al. |
| 6,531,681 | B1 | 3/2003 | Markle et al. |
| 6,534,395 | B2 | 3/2003 | Werkhoven et al. |
| 6,535,535 | B1 | 3/2003 | Yamazaki et al. |
| 6,537,929 | B1 | 3/2003 | Cheung et al. |
| 6,541,367 | B1 | 4/2003 | Mandal |
| 6,541,398 | B2 | 4/2003 | Grill et al. |
| 6,541,401 | B1 | 4/2003 | Herner et al. |
| 6,544,345 | B1 | 4/2003 | Mayer et al. |
| 6,544,900 | B2 | 4/2003 | Raaijmakers et al. |
| 6,548,416 | B2 | 4/2003 | Han et al. |
| 6,548,899 | B2 | 4/2003 | Ross |
| 6,551,926 | B1 | 4/2003 | Ross |
| 6,551,940 | B1 | 4/2003 | Ko |
| 6,555,423 | B2 | 4/2003 | Wada et al. |
| 6,556,280 | B1 | 4/2003 | Kelsey et al. |
| 6,559,026 | B1 | 5/2003 | Rossman et al. |
| 6,559,520 | B2 | 5/2003 | Matsuki et al. |
| 6,561,498 | B2 | 5/2003 | Tompkins et al. |
| 6,562,720 | B2 | 5/2003 | Thilderkvist et al. |
| 6,565,661 | B1 | 5/2003 | Nguyen et al. |
| 6,566,278 | B1 | 5/2003 | Harvey et al. |
| 6,567,219 | B1 | 5/2003 | Tanaka |
| 6,573,030 | B1 | 6/2003 | Fairbairn |
| 6,573,181 | B1 | 6/2003 | Srinivas et al. |
| 6,582,777 | B1 | 6/2003 | Ross |
| 6,583,048 | B1 | 6/2003 | Vincent et al. |
| 6,583,063 | B1 | 6/2003 | Khan et al. |
| 6,583,069 | B1 | 6/2003 | Vassiliev et al. |
| 6,584,987 | B1 | 7/2003 | Cheng et al. |
| 6,586,886 | B1 | 7/2003 | Katz et al. |
| 6,589,610 | B2 | 7/2003 | Li et al. |
| 6,589,611 | B1 | 7/2003 | Li et al. |
| 6,589,868 | B2 | 7/2003 | Rossman |
| 6,596,627 | B2 | 7/2003 | Mandal |
| 6,596,653 | B2 | 7/2003 | Tan et al. |
| 6,596,654 | B1 | 7/2003 | Bayman et al. |
| 6,599,839 | B1 | 7/2003 | Gabriel et al. |
| 6,602,792 | B2 | 8/2003 | Hsu |
| 6,602,806 | B1 | 8/2003 | Xia et al. |
| 6,607,983 | B1 | 8/2003 | Chun et al. |
| 6,607,991 | B1 | 8/2003 | Livesay |
| 6,614,181 | B1 | 9/2003 | Harvey et al. |
| 6,614,977 | B2 | 9/2003 | Johnson et al. |
| 6,616,767 | B2 | 9/2003 | Zhao et al. |
| 6,617,259 | B2 | 9/2003 | Jung et al. |
| 6,618,537 | B2 | 9/2003 | Temkin et al. |
| 6,620,296 | B2 | 9/2003 | Gogh et al. |
| 6,624,064 | B1 | 9/2003 | Sahin et al. |
| 6,624,091 | B2 | 9/2003 | Yuan |
| 6,626,188 | B2 | 9/2003 | Fitzsimmons et al. |
| 6,628,692 | B2 | 9/2003 | Kasamatsu |
| 6,630,413 | B2 | 10/2003 | Todd |
| 6,632,279 | B1 | 10/2003 | Ritala et al. |
| 6,633,076 | B2 | 10/2003 | Krishnaraj et al. |
| 6,635,575 | B1 | 10/2003 | Xia et al. |
| 6,645,303 | B2 | 11/2003 | Frankel et al. |
| 6,652,924 | B2 | 11/2003 | Sherman |
| 6,653,203 | B1 | 11/2003 | Huang et al. |
| 6,656,540 | B2 | 12/2003 | Sakamoto et al. |
| 6,656,804 | B2 | 12/2003 | Tsujikawa et al. |
| 6,660,391 | B1 | 12/2003 | Rose et al. |
| 6,660,662 | B2 | 12/2003 | Ishikawa et al. |
| 6,667,553 | B2 | 12/2003 | Cerny et al. |
| 6,670,284 | B2 | 12/2003 | Yin |
| 6,673,722 | B1 | 1/2004 | Yamazaki et al. |
| 6,676,751 | B2 | 1/2004 | Solomon et al. |
| 6,677,601 | B2 | 1/2004 | Shiraishi |
| 6,677,712 | B2 | 1/2004 | Katz et al. |
| 6,682,659 | B1 | 1/2004 | Cho et al. |
| 6,682,969 | B1 | 1/2004 | Basceri et al. |

(56) References Cited

U.S. PATENT DOCUMENTS

| | | |
|---|---|---|
| 6,683,364 B2 | 1/2004 | Oh et al. |
| 6,703,328 B2 | 3/2004 | Tanaka et al. |
| 6,705,124 B2 | 3/2004 | Zhong et al. |
| 6,706,634 B1 | 3/2004 | Seitz et al. |
| 6,709,715 B1 | 3/2004 | Lang et al. |
| 6,713,127 B2 | 3/2004 | Subramony et al. |
| 6,713,390 B2 | 3/2004 | M'Saad et al. |
| 6,716,770 B2 | 4/2004 | O'Neill et al. |
| 6,720,097 B2 | 4/2004 | Ohkawa et al. |
| 6,727,190 B2 | 4/2004 | Srinivasan et al. |
| 6,733,955 B1 | 5/2004 | Geiger et al. |
| 6,734,101 B1 | 5/2004 | Bao et al. |
| 6,734,115 B2 | 5/2004 | Cheung et al. |
| 6,740,601 B2 | 5/2004 | Tan et al. |
| 6,747,245 B2 | 6/2004 | Talwar et al. |
| 6,756,085 B2 | 6/2004 | Waldfried et al. |
| 6,758,224 B2 | 7/2004 | Nogami |
| 6,759,100 B2 | 7/2004 | Toda et al. |
| 6,759,261 B2 | 7/2004 | Shimokohbe et al. |
| 6,759,662 B1 | 7/2004 | Li |
| 6,762,126 B2 | 7/2004 | Cho et al. |
| 6,770,134 B2 | 8/2004 | Maydan et al. |
| 6,780,574 B2 | 8/2004 | Kawashima |
| 6,787,191 B2 | 9/2004 | Hanahata et al. |
| 6,789,789 B2 | 9/2004 | Randive et al. |
| 6,792,181 B2 | 9/2004 | Sasaki |
| 6,793,733 B2 | 9/2004 | Janakiraman et al. |
| 6,794,290 B1 | 9/2004 | Papasouliotis et al. |
| 6,794,713 B2 | 9/2004 | Mizushima et al. |
| 6,796,148 B1 | 9/2004 | Borrelli et al. |
| 6,797,558 B2 | 9/2004 | Nuttall et al. |
| 6,800,571 B2 | 10/2004 | Cheung et al. |
| 6,805,779 B2 | 10/2004 | Chistyakov |
| 6,806,651 B1 | 10/2004 | Chistyakov |
| 6,807,662 B2 | 10/2004 | Toublan et al. |
| 6,808,748 B2 | 10/2004 | Kapoor et al. |
| 6,808,991 B1 | 10/2004 | Tung |
| 6,809,012 B2 | 10/2004 | Yamazaki et al. |
| 6,812,134 B1 | 11/2004 | Lu et al. |
| 6,812,153 B2 | 11/2004 | Hua et al. |
| 6,812,157 B1 | 11/2004 | Gadgil |
| 6,818,389 B2 | 11/2004 | Fritze et al. |
| 6,818,517 B1 | 11/2004 | Maes |
| 6,819,886 B2 | 11/2004 | Runkowske et al. |
| 6,821,577 B2 | 11/2004 | Rossman |
| 6,821,825 B2 | 11/2004 | Todd et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,835,638 B1 | 12/2004 | Forbes et al. |
| 6,841,341 B2 | 1/2005 | Fairbairn et al. |
| 6,846,742 B2 | 1/2005 | Rossman |
| 6,846,745 B1 | 1/2005 | Papasouliotis et al. |
| 6,849,520 B2 | 2/2005 | Kim et al. |
| 6,853,142 B2 | 2/2005 | Chistyakov |
| 6,858,523 B2 | 2/2005 | DeBoer et al. |
| 6,858,533 B2 | 2/2005 | Chu et al. |
| 6,867,086 B1 | 3/2005 | Chen et al. |
| 6,868,800 B2 | 3/2005 | Moroz |
| 6,870,982 B1 | 3/2005 | Maheshwari |
| 6,872,323 B1 | 3/2005 | Entley et al. |
| 6,875,558 B1 | 4/2005 | Gaillard et al. |
| 6,875,687 B1 | 4/2005 | Weidman et al. |
| 6,876,086 B2 | 4/2005 | Sekine et al. |
| 6,882,477 B1 | 4/2005 | Schattenburg et al. |
| 6,884,685 B2 | 4/2005 | Luo et al. |
| 6,888,096 B1 | 5/2005 | Hamada |
| 6,890,403 B2 | 5/2005 | Cheung et al. |
| 6,896,773 B2 | 5/2005 | Chistyakov |
| 6,900,067 B2 | 5/2005 | Kobayashi et al. |
| 6,903,031 B2 | 6/2005 | Karim et al. |
| 6,905,542 B2 | 6/2005 | Samoilov et al. |
| 6,905,940 B2 | 6/2005 | Ingle et al. |
| 6,916,398 B2 | 7/2005 | Chen et al. |
| 6,919,279 B1 | 7/2005 | Rulkens et al. |
| 6,919,282 B2 | 7/2005 | Sakama et al. |
| 6,926,926 B2 | 8/2005 | Cho et al. |
| 6,929,831 B2 | 8/2005 | Patel et al. |
| 6,935,466 B2 | 8/2005 | Lubomirsky et al. |
| 6,943,091 B2 | 9/2005 | Yu et al. |
| 6,946,358 B2 | 9/2005 | Doris et al. |
| 6,949,447 B2 | 9/2005 | Ahn et al. |
| 6,953,609 B2 | 10/2005 | Carollo |
| 6,955,836 B2 | 10/2005 | Kumagai et al. |
| 6,958,112 B2 | 10/2005 | Karim et al. |
| 6,958,175 B2 | 10/2005 | Sakamoto et al. |
| 6,961,361 B1 | 11/2005 | Tanaka et al. |
| 6,974,781 B2 | 12/2005 | Timmermans et al. |
| 6,987,240 B2 | 1/2006 | Jennings et al. |
| 6,989,337 B2 | 1/2006 | Chu et al. |
| 6,998,355 B2 | 2/2006 | Ohmi et al. |
| 7,004,012 B2 | 2/2006 | Liu et al. |
| 7,005,601 B2 | 2/2006 | Jennings |
| 7,018,902 B2 | 3/2006 | Visokay et al. |
| 7,022,561 B2 | 4/2006 | Huang et al. |
| 7,024,105 B2 | 4/2006 | Fodor et al. |
| 7,037,859 B2 | 5/2006 | Ingle et al. |
| 7,041,543 B1 | 5/2006 | Varadarajan et al. |
| 7,049,211 B2 | 5/2006 | Karim et al. |
| 7,055,127 B2 | 5/2006 | Pierrat et al. |
| 7,056,560 B2 | 6/2006 | Yim et al. |
| 7,074,690 B1 | 7/2006 | Gauri et al. |
| 7,077,904 B2 | 7/2006 | Cho et al. |
| 7,078,651 B2 | 7/2006 | Jennings |
| 7,080,528 B2 | 7/2006 | M'Saad et al. |
| 7,081,414 B2 | 7/2006 | Zhang et al. |
| 7,084,061 B2 | 8/2006 | Sun et al. |
| 7,084,076 B2 | 8/2006 | Park et al. |
| 7,087,497 B2 | 8/2006 | Yuan et al. |
| 7,091,411 B2 | 8/2006 | Falk et al. |
| 7,109,051 B2 | 9/2006 | Cave et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,122,281 B2 | 10/2006 | Pierrat |
| 7,129,185 B2 | 10/2006 | Aoyama et al. |
| 7,132,134 B2 | 11/2006 | Rossman |
| 7,141,483 B2 | 11/2006 | Yuan et al. |
| 7,142,282 B2 | 11/2006 | Borodovsky |
| 7,148,155 B1 | 12/2006 | Tarafdar et al. |
| 7,166,661 B2 | 1/2007 | Kuramoto et al. |
| 7,172,792 B2 | 2/2007 | Wang et al. |
| 7,176,144 B1 | 2/2007 | Wang et al. |
| 7,182,528 B2 | 2/2007 | Mori |
| 7,183,177 B2 | 2/2007 | Al-Bayati et al. |
| 7,183,204 B2 | 2/2007 | Sayama et al. |
| 7,183,214 B2 | 2/2007 | Nam et al. |
| 7,183,227 B1 | 2/2007 | Rasheed et al. |
| 7,192,626 B2 | 3/2007 | Dussarrat et al. |
| 7,205,240 B2 | 4/2007 | Karim et al. |
| 7,205,248 B2 | 4/2007 | Li et al. |
| 7,208,389 B1 | 4/2007 | Tipton et al. |
| 7,208,425 B2 | 4/2007 | Ingle et al. |
| 7,217,658 B1 | 5/2007 | Bayman et al. |
| 7,220,461 B2 | 5/2007 | Hasebe et al. |
| 7,241,690 B2 | 7/2007 | Pavone et al. |
| 7,253,124 B2 | 8/2007 | Lu et al. |
| 7,273,808 B1 | 9/2007 | Lin |
| 7,288,284 B2 | 10/2007 | Li et al. |
| 7,294,588 B2 | 11/2007 | Karim et al. |
| 7,297,608 B1 | 11/2007 | Papasouliotis et al. |
| 7,309,659 B1 | 12/2007 | Subramanian et al. |
| 7,325,419 B2 | 2/2008 | M'Saad et al. |
| 7,335,609 B2 | 2/2008 | Ingle et al. |
| 7,371,427 B2 | 5/2008 | Rajagopalan et al. |
| 7,390,573 B2 | 6/2008 | Korevaar et al. |
| 7,393,561 B2 | 7/2008 | Paranjpe |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,440,088 B2 | 10/2008 | Thomas et al. |
| 7,456,116 B2 | 11/2008 | Ingle et al. |

(56) References Cited

U.S. PATENT DOCUMENTS

| | | |
|---|---|---|
| 7,459,182 B2 | 12/2008 | Xiong et al. |
| 7,479,210 B2 | 1/2009 | Mullapudi et al. |
| 7,498,273 B2 | 3/2009 | Mallick et al. |
| 7,505,647 B2 | 3/2009 | Goebel et al. |
| 7,514,375 B1 | 4/2009 | Shanker et al. |
| 7,521,378 B2 | 4/2009 | Fucsko et al. |
| 7,524,735 B1 * | 4/2009 | Gauri et al. .................. 438/436 |
| 7,524,750 B2 | 4/2009 | Nemani et al. |
| 7,540,920 B2 | 6/2009 | Singh et al. |
| 7,541,297 B2 | 6/2009 | Mallick et al. |
| 7,561,252 B2 | 7/2009 | Sewell et al. |
| 7,566,655 B2 | 7/2009 | Balseanu et al. |
| 7,582,555 B1 | 9/2009 | Lang et al. |
| 7,608,300 B2 | 10/2009 | Bencher et al. |
| 7,622,369 B1 | 11/2009 | Lee et al. |
| 7,629,227 B1 | 12/2009 | Wang et al. |
| 7,642,041 B2 | 1/2010 | Wago |
| 7,642,171 B2 | 1/2010 | Ingle et al. |
| 7,645,339 B2 | 1/2010 | Singh et al. |
| 7,674,727 B2 | 3/2010 | Yuan et al. |
| 7,691,753 B2 | 4/2010 | Zhang et al. |
| 7,723,228 B2 | 5/2010 | Rajagopalan et al. |
| 7,732,342 B2 | 6/2010 | Balseanu et al. |
| 7,745,350 B2 | 6/2010 | Wang et al. |
| 7,745,352 B2 | 6/2010 | Mallick et al. |
| 7,749,574 B2 | 7/2010 | Mahajani et al. |
| 7,758,697 B2 | 7/2010 | Comita et al. |
| 7,790,634 B2 | 9/2010 | Munro et al. |
| 7,799,698 B2 | 9/2010 | Zhang et al. |
| 7,803,722 B2 | 9/2010 | Liang |
| 7,815,982 B2 | 10/2010 | Iwanaga |
| 7,825,038 B2 | 11/2010 | Ingle et al. |
| 7,825,044 B2 | 11/2010 | Mallick et al. |
| 7,867,921 B2 | 1/2011 | Wang et al. |
| 7,867,923 B2 | 1/2011 | Mallick et al. |
| 7,869,672 B2 | 1/2011 | Goebel et al. |
| 7,872,209 B2 | 1/2011 | Jennings et al. |
| 7,875,829 B2 | 1/2011 | Jennings et al. |
| 7,902,080 B2 | 3/2011 | Chen et al. |
| 7,910,491 B2 | 3/2011 | Soo Kwon et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,964,040 B2 | 6/2011 | Rasheed et al. |
| 7,989,365 B2 | 8/2011 | Park et al. |
| 7,993,733 B2 | 8/2011 | Stowell et al. |
| 7,994,019 B1 | 8/2011 | Kweskin et al. |
| 8,023,782 B2 | 9/2011 | Goebel et al. |
| 8,057,649 B2 | 11/2011 | Stowell et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,329,587 B2 | 12/2012 | Liang et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 | 6/2013 | Wang et al. |
| 2001/0000866 A1 | 5/2001 | Sneh et al. |
| 2001/0006070 A1 | 7/2001 | Shang et al. |
| 2001/0008742 A1 | 7/2001 | Jen et al. |
| 2001/0019860 A1 | 9/2001 | Adachi et al. |
| 2001/0020712 A1 | 9/2001 | Raaijmakers et al. |
| 2001/0020722 A1 | 9/2001 | Yang |
| 2001/0021595 A1 | 9/2001 | Jang |
| 2001/0024387 A1 | 9/2001 | Raaijmakers et al. |
| 2001/0024691 A1 | 9/2001 | Kimura et al. |
| 2001/0024871 A1 | 9/2001 | Yagi |
| 2001/0025607 A1 | 10/2001 | Lebar et al. |
| 2001/0027964 A1 | 10/2001 | Isaji et al. |
| 2001/0028922 A1 | 10/2001 | Sandhu |
| 2001/0028924 A1 | 10/2001 | Sherman |
| 2001/0029114 A1 | 10/2001 | Vulpio et al. |
| 2001/0029892 A1 | 10/2001 | Cook et al. |
| 2001/0033900 A1 | 10/2001 | M'Saad et al. |
| 2001/0034123 A1 | 10/2001 | Jeon et al. |
| 2001/0038919 A1 | 11/2001 | Berry et al. |
| 2001/0040099 A1 | 11/2001 | Pedersen et al. |
| 2001/0041250 A1 | 11/2001 | Sneh et al. |
| 2001/0042511 A1 | 11/2001 | Liu et al. |
| 2001/0046567 A1 | 11/2001 | Matsuki et al. |
| 2001/0048980 A1 | 12/2001 | Kishimoto et al. |
| 2001/0054387 A1 | 12/2001 | Frankel et al. |
| 2001/0055672 A1 | 12/2001 | Todd |
| 2001/0055877 A1 | 12/2001 | Vaartstra |
| 2001/0055889 A1 | 12/2001 | Iyer |
| 2002/0000195 A1 | 1/2002 | Bang et al. |
| 2002/0000196 A1 | 1/2002 | Park |
| 2002/0000202 A1 | 1/2002 | Yuda et al. |
| 2002/0000598 A1 | 1/2002 | Kang et al. |
| 2002/0004282 A1 | 1/2002 | Hong |
| 2002/0006729 A1 | 1/2002 | Geiger et al. |
| 2002/0007790 A1 | 1/2002 | Park |
| 2002/0011210 A1 | 1/2002 | Satoh et al. |
| 2002/0011215 A1 | 1/2002 | Tel et al. |
| 2002/0016084 A1 | 2/2002 | Todd |
| 2002/0027286 A1 | 3/2002 | Sundararajan et al. |
| 2002/0031618 A1 | 3/2002 | Sherman |
| 2002/0031725 A1 | 3/2002 | Sugita et al. |
| 2002/0034645 A1 | 3/2002 | Kondo et al. |
| 2002/0037132 A1 | 3/2002 | Sercel et al. |
| 2002/0040847 A1 | 4/2002 | Ohmi et al. |
| 2002/0041044 A1 | 4/2002 | Saito et al. |
| 2002/0047151 A1 | 4/2002 | Kim et al. |
| 2002/0048969 A1 | 4/2002 | Suzuki et al. |
| 2002/0050605 A1 | 5/2002 | Jenq |
| 2002/0052077 A1 | 5/2002 | Tee et al. |
| 2002/0052128 A1 | 5/2002 | Yu et al. |
| 2002/0068416 A1 | 6/2002 | Hsieh et al. |
| 2002/0068458 A1 | 6/2002 | Chiang et al. |
| 2002/0068466 A1 | 6/2002 | Lee et al. |
| 2002/0074588 A1 | 6/2002 | Lee |
| 2002/0076317 A1 | 6/2002 | Reimer et al. |
| 2002/0076837 A1 | 6/2002 | Hujanen et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0090818 A1 | 7/2002 | Thilderkvist et al. |
| 2002/0092766 A1 | 7/2002 | Lampkin |
| 2002/0093042 A1 | 7/2002 | Oh et al. |
| 2002/0094483 A1 | 7/2002 | Hattori et al. |
| 2002/0098627 A1 | 7/2002 | Pomarede et al. |
| 2002/0098712 A1 | 7/2002 | Mavoori et al. |
| 2002/0102358 A1 | 8/2002 | Das et al. |
| 2002/0119607 A1 | 8/2002 | Miyasaka et al. |
| 2002/0125423 A1 | 9/2002 | Ebeling et al. |
| 2002/0127350 A1 | 9/2002 | Ishikawa et al. |
| 2002/0127841 A1 | 9/2002 | Horita et al. |
| 2002/0129769 A1 | 9/2002 | Kim et al. |
| 2002/0139307 A1 | 10/2002 | Ryding et al. |
| 2002/0142585 A1 | 10/2002 | Mandal |
| 2002/0145168 A1 | 10/2002 | Bojarczuk, Jr. et al. |
| 2002/0145712 A1 | 10/2002 | Kochi |
| 2002/0146512 A1 | 10/2002 | Rossman |
| 2002/0146879 A1 | 10/2002 | Fu et al. |
| 2002/0149751 A1 | 10/2002 | Bloomstein et al. |
| 2002/0155722 A1 | 10/2002 | Satta et al. |
| 2002/0160585 A1 | 10/2002 | Park |
| 2002/0163028 A1 | 11/2002 | Zheng |
| 2002/0163637 A1 | 11/2002 | Rossman et al. |
| 2002/0164421 A1 | 11/2002 | Chiang et al. |
| 2002/0164429 A1 | 11/2002 | Gaillard et al. |
| 2002/0164890 A1 | 11/2002 | Kwan et al. |
| 2002/0164891 A1 | 11/2002 | Gates et al. |
| 2002/0168828 A1 | 11/2002 | Cheng et al. |
| 2002/0168840 A1 | 11/2002 | Hong et al. |
| 2002/0168868 A1 | 11/2002 | Todd |
| 2002/0170487 A1 | 11/2002 | Zehavi et al. |

(56) References Cited

U.S. PATENT DOCUMENTS

| | | |
|---|---|---|
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0177298 A1 | 11/2002 | Konishi et al. |
| 2002/0182342 A1 | 12/2002 | Ouellet et al. |
| 2002/0182893 A1 | 12/2002 | Ballantine et al. |
| 2002/0185067 A1 | 12/2002 | Upham |
| 2002/0187655 A1 | 12/2002 | Tan et al. |
| 2002/0189760 A1 | 12/2002 | Park |
| 2002/0189940 A1 | 12/2002 | Tsai et al. |
| 2002/0192370 A1 | 12/2002 | Metzner et al. |
| 2002/0192393 A1 | 12/2002 | Ouellet et al. |
| 2002/0192396 A1 | 12/2002 | Wang et al. |
| 2002/0197823 A1 | 12/2002 | Yoo et al. |
| 2002/0197831 A1 | 12/2002 | Todd et al. |
| 2002/0197849 A1 | 12/2002 | Mandal |
| 2002/0197881 A1 | 12/2002 | Ramdani et al. |
| 2003/0001201 A1 | 1/2003 | Yuzuriha et al. |
| 2003/0003610 A1 | 1/2003 | Yamazaki et al. |
| 2003/0013320 A1 | 1/2003 | Kim et al. |
| 2003/0015764 A1 | 1/2003 | Raaijmakers et al. |
| 2003/0019428 A1 | 1/2003 | Ku et al. |
| 2003/0022523 A1 | 1/2003 | Irino et al. |
| 2003/0022528 A1 | 1/2003 | Todd |
| 2003/0023113 A1 | 1/2003 | Druzkowski et al. |
| 2003/0032207 A1 | 2/2003 | Rengarajan et al. |
| 2003/0032281 A1 | 2/2003 | Werkhoven et al. |
| 2003/0036268 A1 | 2/2003 | Brabant et al. |
| 2003/0040199 A1 | 2/2003 | Agarwal |
| 2003/0049942 A1 | 3/2003 | Haukka et al. |
| 2003/0054670 A1 | 3/2003 | Wang et al. |
| 2003/0056900 A1 | 3/2003 | Li et al. |
| 2003/0057432 A1 | 3/2003 | Gardner et al. |
| 2003/0059535 A1 | 3/2003 | Luo et al. |
| 2003/0060057 A1 | 3/2003 | Raaijmakers et al. |
| 2003/0064154 A1 | 4/2003 | Laxman et al. |
| 2003/0068437 A1 | 4/2003 | Nakamura et al. |
| 2003/0068890 A1 | 4/2003 | Park |
| 2003/0068902 A1 | 4/2003 | Wang et al. |
| 2003/0070451 A1 | 4/2003 | Ouellet et al. |
| 2003/0071304 A1 | 4/2003 | Ogle, Jr. et al. |
| 2003/0071312 A1 | 4/2003 | Oana et al. |
| 2003/0072695 A1 | 4/2003 | Ruelke et al. |
| 2003/0072884 A1 | 4/2003 | Zhang et al. |
| 2003/0072932 A1 | 4/2003 | Gandon |
| 2003/0072975 A1 | 4/2003 | Shero et al. |
| 2003/0073290 A1 | 4/2003 | Ramkumar et al. |
| 2003/0073310 A1 | 4/2003 | Olgado et al. |
| 2003/0077918 A1 | 4/2003 | Wu et al. |
| 2003/0082300 A1 | 5/2003 | Todd et al. |
| 2003/0089308 A1 | 5/2003 | Raaijmakers |
| 2003/0089314 A1 | 5/2003 | Matsuki et al. |
| 2003/0089942 A1 | 5/2003 | Bhattacharyya |
| 2003/0091938 A1 | 5/2003 | Fairbairn |
| 2003/0094773 A1 | 5/2003 | Lerner |
| 2003/0101927 A1 | 6/2003 | Raaijmakers |
| 2003/0101938 A1 | 6/2003 | Ronsse et al. |
| 2003/0104677 A1 | 6/2003 | Park et al. |
| 2003/0107079 A1 | 6/2003 | Iwata et al. |
| 2003/0110808 A1 | 6/2003 | M'Saad et al. |
| 2003/0111961 A1 | 6/2003 | Katz et al. |
| 2003/0113085 A1 | 6/2003 | M'Saad et al. |
| 2003/0113992 A1 | 6/2003 | Yau et al. |
| 2003/0116804 A1 | 6/2003 | Visokay et al. |
| 2003/0118748 A1 | 6/2003 | Kumagai et al. |
| 2003/0123040 A1 | 7/2003 | Almogy |
| 2003/0124873 A1 | 7/2003 | Xing et al. |
| 2003/0128543 A1 | 7/2003 | Rekow |
| 2003/0128925 A1 | 7/2003 | Wickman |
| 2003/0129826 A1 | 7/2003 | Werkhoven et al. |
| 2003/0134038 A1 | 7/2003 | Paranjpe |
| 2003/0138562 A1 | 7/2003 | Subramony et al. |
| 2003/0140851 A1 | 7/2003 | Janakiraman et al. |
| 2003/0143328 A1 | 7/2003 | Chen et al. |
| 2003/0143410 A1 | 7/2003 | Won et al. |
| 2003/0143841 A1 | 7/2003 | Yang et al. |
| 2003/0150846 A1 | 8/2003 | Ishii et al. |
| 2003/0155234 A1 | 8/2003 | Feltsman et al. |
| 2003/0159656 A1 | 8/2003 | Tan et al. |
| 2003/0160277 A1 | 8/2003 | Bhattacharyya |
| 2003/0165749 A1 | 9/2003 | Fritze et al. |
| 2003/0168006 A1 | 9/2003 | Williams |
| 2003/0168172 A1 | 9/2003 | Glukhoy |
| 2003/0172872 A1 | 9/2003 | Thakur et al. |
| 2003/0173586 A1 | 9/2003 | Moriwaki et al. |
| 2003/0180458 A1 | 9/2003 | Sneh |
| 2003/0183518 A1 | 10/2003 | Glocker et al. |
| 2003/0185980 A1 | 10/2003 | Endo |
| 2003/0188682 A1 | 10/2003 | Tois et al. |
| 2003/0189208 A1 | 10/2003 | Law et al. |
| 2003/0194853 A1 | 10/2003 | Jeon et al. |
| 2003/0194881 A1 | 10/2003 | Totsuka et al. |
| 2003/0196995 A1 | 10/2003 | Jennings |
| 2003/0196996 A1 | 10/2003 | Jennings et al. |
| 2003/0197831 A1 | 10/2003 | Kim et al. |
| 2003/0199151 A1 | 10/2003 | Ho et al. |
| 2003/0201723 A1 | 10/2003 | Katz et al. |
| 2003/0203515 A1 | 10/2003 | Lin et al. |
| 2003/0203637 A1 | 10/2003 | Hua et al. |
| 2003/0203653 A1 | 10/2003 | Buchanan et al. |
| 2003/0205729 A1 | 11/2003 | Basceri et al. |
| 2003/0207033 A1 | 11/2003 | Yim |
| 2003/0207530 A1 | 11/2003 | Yu et al. |
| 2003/0207561 A1 | 11/2003 | Dubin et al. |
| 2003/0207580 A1 | 11/2003 | Li et al. |
| 2003/0209323 A1 | 11/2003 | Yokogaki |
| 2003/0209422 A1 | 11/2003 | Wang et al. |
| 2003/0216006 A1 | 11/2003 | Li et al. |
| 2003/0217693 A1 | 11/2003 | Rattner et al. |
| 2003/0219540 A1 | 11/2003 | Law et al. |
| 2003/0223681 A1 | 12/2003 | Frick |
| 2003/0224217 A1 | 12/2003 | Byun et al. |
| 2003/0228770 A1 | 12/2003 | Lee et al. |
| 2003/0230385 A1 | 12/2003 | Bach et al. |
| 2003/0232495 A1 | 12/2003 | Moghadam et al. |
| 2003/0235994 A1 | 12/2003 | Pan et al. |
| 2004/0003873 A1 | 1/2004 | Chen et al. |
| 2004/0008334 A1 | 1/2004 | Sreenivasan et al. |
| 2004/0009678 A1 | 1/2004 | Asai et al. |
| 2004/0011466 A1 | 1/2004 | Matsumoto et al. |
| 2004/0015300 A1 | 1/2004 | Ganguli et al. |
| 2004/0018699 A1 | 1/2004 | Boyd et al. |
| 2004/0020601 A1 | 2/2004 | Zhao et al. |
| 2004/0029323 A1 | 2/2004 | Shimizu et al. |
| 2004/0029352 A1 | 2/2004 | Beyer et al. |
| 2004/0029353 A1 | 2/2004 | Zheng et al. |
| 2004/0029398 A1 | 2/2004 | Lee et al. |
| 2004/0033639 A1 | 2/2004 | Chinn et al. |
| 2004/0033674 A1 | 2/2004 | Todd |
| 2004/0038529 A1 | 2/2004 | Soininen et al. |
| 2004/0043626 A1 | 3/2004 | San et al. |
| 2004/0045577 A1 | 3/2004 | Ji et al. |
| 2004/0048485 A1 | 3/2004 | Min et al. |
| 2004/0048492 A1 | 3/2004 | Ishikawa et al. |
| 2004/0050492 A1 | 3/2004 | Lun et al. |
| 2004/0052969 A1 | 3/2004 | Lee et al. |
| 2004/0053450 A1 | 3/2004 | Sposili et al. |
| 2004/0058517 A1 | 3/2004 | Padmapani et al. |
| 2004/0060514 A1 | 4/2004 | Janakiraman et al. |
| 2004/0061229 A1 | 4/2004 | Moslehi |
| 2004/0063290 A1 | 4/2004 | Jennings et al. |
| 2004/0065253 A1 | 4/2004 | Tois et al. |
| 2004/0079118 A1 | 4/2004 | M'Saad et al. |
| 2004/0082131 A1 | 4/2004 | Tsujikawa et al. |
| 2004/0083964 A1 | 5/2004 | Ingle et al. |
| 2004/0083967 A1 | 5/2004 | Yuda et al. |
| 2004/0084680 A1 | 5/2004 | Ruelke et al. |
| 2004/0090194 A1 | 5/2004 | Gesley |
| 2004/0094091 A1 | 5/2004 | Yang et al. |
| 2004/0096672 A1 | 5/2004 | Lukas et al. |
| 2004/0097030 A1 | 5/2004 | Hirokazu et al. |
| 2004/0101633 A1 | 5/2004 | Zheng et al. |
| 2004/0110092 A1 | 6/2004 | Lin |
| 2004/0110354 A1 | 6/2004 | Natzle et al. |

(56) References Cited

U.S. PATENT DOCUMENTS

| | | |
|---|---|---|
| 2004/0113217 A1 | 6/2004 | Chidambarrao et al. |
| 2004/0113227 A1 | 6/2004 | Goto et al. |
| 2004/0115898 A1 | 6/2004 | Moghadam et al. |
| 2004/0115954 A1 | 6/2004 | Todd |
| 2004/0118519 A1 | 6/2004 | Soovo |
| 2004/0126952 A1 | 7/2004 | Gondhalekar et al. |
| 2004/0134773 A1 | 7/2004 | Pedersen et al. |
| 2004/0139983 A1 | 7/2004 | Lakshmanan et al. |
| 2004/0144490 A1 | 7/2004 | Zhao et al. |
| 2004/0145029 A1 | 7/2004 | Adetutu et al. |
| 2004/0146661 A1 | 7/2004 | Kapoor et al. |
| 2004/0152342 A1 | 8/2004 | Li et al. |
| 2004/0159343 A1 | 8/2004 | Kaoru et al. |
| 2004/0159834 A1 | 8/2004 | Huang et al. |
| 2004/0161899 A1 | 8/2004 | Luo et al. |
| 2004/0161903 A1 | 8/2004 | Yuan et al. |
| 2004/0163590 A1 | 8/2004 | Tran et al. |
| 2004/0163762 A1 | 8/2004 | Iizuka et al. |
| 2004/0166680 A1 | 8/2004 | Miyajima et al. |
| 2004/0166694 A1 | 8/2004 | Won et al. |
| 2004/0166695 A1 | 8/2004 | Yuan et al. |
| 2004/0166696 A1 | 8/2004 | Lee |
| 2004/0175501 A1 | 9/2004 | Lukas et al. |
| 2004/0175883 A1 | 9/2004 | Kim |
| 2004/0175957 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0192061 A1 | 9/2004 | Sasaki et al. |
| 2004/0194706 A1 | 10/2004 | Wang et al. |
| 2004/0197474 A1 | 10/2004 | Vrtis et al. |
| 2004/0197843 A1 | 10/2004 | Chou et al. |
| 2004/0200499 A1 | 10/2004 | Harvey et al. |
| 2004/0206305 A1 | 10/2004 | Choi et al. |
| 2004/0206621 A1 | 10/2004 | Li et al. |
| 2004/0206729 A1 | 10/2004 | Shinohara |
| 2004/0211664 A1 | 10/2004 | Wang |
| 2004/0212036 A1 | 10/2004 | Li et al. |
| 2004/0216844 A1 | 11/2004 | Janakiraman et al. |
| 2004/0219780 A1 | 11/2004 | Ohuchi |
| 2004/0224534 A1 | 11/2004 | Beulens et al. |
| 2004/0224537 A1 | 11/2004 | Lee et al. |
| 2004/0226911 A1 | 11/2004 | Dutton et al. |
| 2004/0229051 A1 | 11/2004 | Schaepkens et al. |
| 2004/0231590 A1 | 11/2004 | Ovshinsky |
| 2004/0231795 A1 | 11/2004 | Rajagopalan et al. |
| 2004/0231799 A1 | 11/2004 | Lee et al. |
| 2004/0235292 A1 | 11/2004 | Rajagopalan et al. |
| 2004/0241342 A1 | 12/2004 | Karim et al. |
| 2004/0245091 A1 | 12/2004 | Karim et al. |
| 2004/0248374 A1 | 12/2004 | Belyansky et al. |
| 2004/0249006 A1 | 12/2004 | Gleason et al. |
| 2004/0251236 A1 | 12/2004 | Zhang et al. |
| 2004/0253776 A1 | 12/2004 | Hoffmann et al. |
| 2004/0253791 A1 | 12/2004 | Min-Chui et al. |
| 2004/0253826 A1 | 12/2004 | Ivanov et al. |
| 2004/0259042 A1 | 12/2004 | Fritze et al. |
| 2004/0265507 A1 | 12/2004 | Xiong et al. |
| 2004/0266083 A1 | 12/2004 | Hareland et al. |
| 2005/0001556 A1 | 1/2005 | Hoffman et al. |
| 2005/0008790 A1 | 1/2005 | Bikram et al. |
| 2005/0014354 A1 | 1/2005 | Ozawa et al. |
| 2005/0016956 A1 | 1/2005 | Liu et al. |
| 2005/0019494 A1 | 1/2005 | Moghadam et al. |
| 2005/0026443 A1 | 2/2005 | Goo et al. |
| 2005/0032321 A1 | 2/2005 | Huang et al. |
| 2005/0040460 A1 | 2/2005 | Chidambarrao et al. |
| 2005/0042889 A1 | 2/2005 | Lee et al. |
| 2005/0048801 A1 | 3/2005 | Karim et al. |
| 2005/0062165 A1 | 3/2005 | Saenger et al. |
| 2005/0064297 A1 | 3/2005 | Wago |
| 2005/0064730 A1 | 3/2005 | Ingle et al. |
| 2005/0070100 A1 | 3/2005 | Yamasaki et al. |
| 2005/0073671 A1 | 4/2005 | Borodovsky |
| 2005/0074698 A1 | 4/2005 | Borodovsky |
| 2005/0078953 A1 | 4/2005 | Fodor et al. |
| 2005/0079691 A1 | 4/2005 | Kim et al. |
| 2005/0083497 A1 | 4/2005 | Borodovsky |
| 2005/0085085 A1 | 4/2005 | Borodovsky |
| 2005/0087140 A1 | 4/2005 | Yuda et al. |
| 2005/0088633 A1 | 4/2005 | Borodovsky |
| 2005/0093078 A1 | 5/2005 | Chan et al. |
| 2005/0095859 A1 | 5/2005 | Chen et al. |
| 2005/0098829 A1 | 5/2005 | Doris et al. |
| 2005/0103266 A1 | 5/2005 | Chandran et al. |
| 2005/0112901 A1 | 5/2005 | Ji et al. |
| 2005/0118428 A1 | 6/2005 | Bicker et al. |
| 2005/0118794 A1 | 6/2005 | Babayan et al. |
| 2005/0121145 A1 | 6/2005 | Du Bois et al. |
| 2005/0121835 A1 | 6/2005 | Herod et al. |
| 2005/0124166 A1 | 6/2005 | Krishnaraj et al. |
| 2005/0129404 A1 | 6/2005 | Kim et al. |
| 2005/0136610 A1 | 6/2005 | Kitagawa et al. |
| 2005/0139872 A1 | 6/2005 | Chidambaram et al. |
| 2005/0142895 A1 | 6/2005 | Ingle et al. |
| 2005/0150452 A1 | 7/2005 | Sen et al. |
| 2005/0153519 A1 | 7/2005 | Lu et al. |
| 2005/0153574 A1 | 7/2005 | Mandal |
| 2005/0160383 A1 | 7/2005 | Lin |
| 2005/0160974 A1 | 7/2005 | Ivanov et al. |
| 2005/0164517 A1 | 7/2005 | Karim et al. |
| 2005/0167742 A1 | 8/2005 | Challa et al. |
| 2005/0181555 A1 | 8/2005 | Haukka et al. |
| 2005/0186731 A1 | 8/2005 | Derderian et al. |
| 2005/0186755 A1 | 8/2005 | Smythe et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196971 A1 | 9/2005 | Sen et al. |
| 2005/0196977 A1 | 9/2005 | Saito et al. |
| 2005/0211170 A1 | 9/2005 | Hanawa et al. |
| 2005/0214454 A1 | 9/2005 | Yang et al. |
| 2005/0214477 A1 | 9/2005 | Hanawa et al. |
| 2005/0217578 A1 | 10/2005 | Gurary et al. |
| 2005/0218124 A1 | 10/2005 | Jennings et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0238965 A1 | 10/2005 | Tyrrell et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0266323 A1 | 12/2005 | Raulea |
| 2005/0266655 A1 | 12/2005 | Nemani et al. |
| 2005/0271812 A1 | 12/2005 | Myo et al. |
| 2005/0272254 A1 | 12/2005 | Ding et al. |
| 2005/0274128 A1 | 12/2005 | Kishorenath et al. |
| 2005/0285140 A1 | 12/2005 | Ko et al. |
| 2005/0287775 A1 | 12/2005 | Hasebe et al. |
| 2006/0011984 A1 | 1/2006 | Currie |
| 2006/0012938 A1 | 1/2006 | Park |
| 2006/0014399 A1 | 1/2006 | Joe |
| 2006/0017910 A1 | 1/2006 | Borodovsky |
| 2006/0019486 A1 | 1/2006 | Yu et al. |
| 2006/0021702 A1 | 2/2006 | Kumar et al. |
| 2006/0030151 A1 | 2/2006 | Ding et al. |
| 2006/0030165 A1 | 2/2006 | Ingle et al. |
| 2006/0045986 A1 | 3/2006 | Hochberg et al. |
| 2006/0046156 A1 | 3/2006 | Amako et al. |
| 2006/0046160 A1 | 3/2006 | Wallace et al. |
| 2006/0046427 A1 | 3/2006 | Ingle et al. |
| 2006/0046506 A1 | 3/2006 | Fukiage |
| 2006/0046508 A1 | 3/2006 | Nemani et al. |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0075967 A1 | 4/2006 | Lu et al. |
| 2006/0078717 A1 | 4/2006 | Yamaya et al. |
| 2006/0084236 A1 | 4/2006 | Vogt |
| 2006/0088985 A1 | 4/2006 | Haverkort et al. |
| 2006/0090694 A1 | 5/2006 | Cho et al. |
| 2006/0091104 A1 | 5/2006 | Takeshita et al. |

(56) References Cited

U.S. PATENT DOCUMENTS

| | | |
|---|---|---|
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0148270 A1 | 7/2006 | Lu et al. |
| 2006/0148273 A1 | 7/2006 | Ingle et al. |
| 2006/0158101 A1 | 7/2006 | Camilletti et al. |
| 2006/0159847 A1 | 7/2006 | Porter et al. |
| 2006/0160314 A1 | 7/2006 | Arghavani |
| 2006/0160372 A1 | 7/2006 | Dorfman |
| 2006/0162661 A1 | 7/2006 | Jung et al. |
| 2006/0166515 A1 | 7/2006 | Karim et al. |
| 2006/0178018 A1 | 8/2006 | Olsen |
| 2006/0191478 A1 | 8/2006 | Gondhalekar et al. |
| 2006/0196766 A1 | 9/2006 | Chen |
| 2006/0199305 A1 | 9/2006 | Chen et al. |
| 2006/0205150 A1 | 9/2006 | Dong |
| 2006/0207294 A1 | 9/2006 | M'Saad et al. |
| 2006/0207504 A1 | 9/2006 | Hasebe et al. |
| 2006/0208634 A1 | 9/2006 | Schaepkens et al. |
| 2006/0211265 A1 | 9/2006 | Trott |
| 2006/0216651 A1 | 9/2006 | Ho et al. |
| 2006/0223290 A1 | 10/2006 | Belyansky et al. |
| 2006/0223315 A1 | 10/2006 | Yokota et al. |
| 2006/0224451 A1 | 10/2006 | Kerschbrock et al. |
| 2006/0225648 A1 | 10/2006 | Rasheed et al. |
| 2006/0228903 A1 | 10/2006 | McSwiney et al. |
| 2006/0240232 A1 | 10/2006 | Faris |
| 2006/0251499 A1 | 11/2006 | Lunday et al. |
| 2006/0252240 A1 | 11/2006 | Gschwandtner et al. |
| 2006/0263522 A1 | 11/2006 | Byun |
| 2006/0264062 A1 | 11/2006 | Ingle et al. |
| 2006/0269692 A1 | 11/2006 | Balseanu et al. |
| 2006/0269693 A1 | 11/2006 | Balseanu et al. |
| 2006/0274295 A1 | 12/2006 | Brueck et al. |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2006/0292894 A1 | 12/2006 | Vellaikal et al. |
| 2007/0004170 A1 | 1/2007 | Kawasaki et al. |
| 2007/0007548 A1 | 1/2007 | Conti et al. |
| 2007/0010072 A1 | 1/2007 | Bailey et al. |
| 2007/0020392 A1 | 1/2007 | Kobrin et al. |
| 2007/0020875 A1 | 1/2007 | Hsu et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0045103 A1 | 3/2007 | Lee et al. |
| 2007/0048509 A1 | 3/2007 | Yoneyama et al. |
| 2007/0049044 A1 | 3/2007 | Marsh |
| 2007/0059896 A1 | 3/2007 | Yuan et al. |
| 2007/0065578 A1 | 3/2007 | McDougall |
| 2007/0066005 A1 | 3/2007 | Katsuhiko et al. |
| 2007/0066022 A1 | 3/2007 | Chen et al. |
| 2007/0077777 A1 | 4/2007 | Gumpher |
| 2007/0080056 A1 | 4/2007 | German et al. |
| 2007/0080057 A1 | 4/2007 | Yasuhiro et al. |
| 2007/0092661 A1 | 4/2007 | Ryuzaki et al. |
| 2007/0098916 A1 | 5/2007 | Stowell |
| 2007/0099438 A1 | 5/2007 | Ye et al. |
| 2007/0102634 A1 | 5/2007 | Frey et al. |
| 2007/0108166 A1 | 5/2007 | Jennings et al. |
| 2007/0108404 A1 | 5/2007 | Stewart et al. |
| 2007/0111546 A1 | 5/2007 | Iyer et al. |
| 2007/0119546 A1 | 5/2007 | Collins et al. |
| 2007/0128864 A1 | 6/2007 | Ma et al. |
| 2007/0134433 A1 | 6/2007 | Dussarrat et al. |
| 2007/0139633 A1 | 6/2007 | Bleeker et al. |
| 2007/0160822 A1 | 7/2007 | Bristow et al. |
| 2007/0166892 A1 | 7/2007 | Hori |
| 2007/0173073 A1 | 7/2007 | Weber |
| 2007/0181145 A1 | 8/2007 | Ishizuka et al. |
| 2007/0181966 A1 | 8/2007 | Watatani et al. |
| 2007/0197028 A1 | 8/2007 | Byun et al. |
| 2007/0207590 A1 | 9/2007 | Kiyotoshi et al. |
| 2007/0212850 A1 | 9/2007 | Ingle et al. |
| 2007/0218264 A1 | 9/2007 | Gueneau et al. |
| 2007/0221127 A1 | 9/2007 | Tran et al. |
| 2007/0232071 A1 | 10/2007 | Balseanu et al. |
| 2007/0232082 A1 | 10/2007 | Balseanu et al. |
| 2007/0235062 A1 | 10/2007 | Naozumi et al. |
| 2007/0240631 A1 | 10/2007 | Nijhawan et al. |
| 2007/0253881 A1 | 11/2007 | Maekawa et al. |
| 2007/0254093 A1 | 11/2007 | Nijhawan et al. |
| 2007/0254100 A1 | 11/2007 | Nijhawan et al. |
| 2007/0275569 A1 | 11/2007 | Moghadam et al. |
| 2007/0277734 A1 | 12/2007 | Lubomirsky et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1 | 1/2008 | Munro et al. |
| 2008/0038486 A1 | 2/2008 | Treichel et al. |
| 2008/0041831 A1 | 2/2008 | Jennings et al. |
| 2008/0063809 A1 | 3/2008 | Lee et al. |
| 2008/0070409 A1 | 3/2008 | Park et al. |
| 2008/0081104 A1 | 4/2008 | Hasebe et al. |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0115726 A1 | 5/2008 | Ingle et al. |
| 2008/0118734 A1 | 5/2008 | Goodwin et al. |
| 2008/0124084 A1 | 5/2008 | Goebel et al. |
| 2008/0152838 A1 | 6/2008 | Sen et al. |
| 2008/0173402 A1 | 7/2008 | Suzuki et al. |
| 2008/0176390 A1 | 7/2008 | Cheng |
| 2008/0178805 A1 | 7/2008 | Paterson et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0216958 A1 | 9/2008 | Goto et al. |
| 2008/0226924 A1 | 9/2008 | Okubo et al. |
| 2008/0241358 A1 | 10/2008 | Joe et al. |
| 2008/0251016 A1 | 10/2008 | Cunning et al. |
| 2008/0260969 A1 | 10/2008 | Dussarrat et al. |
| 2008/0292798 A1 | 11/2008 | Huh et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0046263 A1 | 2/2009 | Liu et al. |
| 2009/0047604 A1 | 2/2009 | Stoeldraijer et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat et al. |
| 2009/0085096 A1 | 4/2009 | Park et al. |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104791 A1 | 4/2009 | Mallick et al. |
| 2009/0104790 A1* | 4/2009 | Liang ............................ 438/788 |
| 2009/0104791 A1 | 4/2009 | Nemani et al. |
| 2009/0104798 A1 | 4/2009 | Hirano |
| 2009/0111056 A1 | 4/2009 | Hendel et al. |
| 2009/0117491 A1 | 5/2009 | Hendel et al. |
| 2009/0120368 A1 | 5/2009 | Lubomirsky et al. |
| 2009/0120464 A1 | 5/2009 | Muhammad et al. |
| 2009/0120584 A1 | 5/2009 | Lubomirsky et al. |
| 2009/0142935 A1 | 6/2009 | Fukuzawa et al. |
| 2009/0170282 A1 | 7/2009 | Dong |
| 2009/0181550 A1 | 7/2009 | Hasebe et al. |
| 2009/0194809 A1 | 8/2009 | Cho |

(56) References Cited

U.S. PATENT DOCUMENTS

| | | |
|---|---|---|
| 2009/0203225 A1 | 8/2009 | Gates et al. |
| 2009/0206409 A1 | 8/2009 | Arisumi et al. |
| 2009/0208715 A1 | 8/2009 | Stowell et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232977 A1 | 9/2009 | Morinaga et al. |
| 2009/0232985 A1 | 9/2009 | Dussarrat et al. |
| 2009/0238993 A1 | 9/2009 | Stowell et al. |
| 2009/0238998 A1 | 9/2009 | Stowell et al. |
| 2009/0242957 A1 | 10/2009 | Ma et al. |
| 2009/0252495 A1 | 10/2009 | Goebel et al. |
| 2009/0277587 A1 | 11/2009 | Lubomirsky et al. |
| 2009/0277778 A1 | 11/2009 | Stowell et al. |
| 2009/0280650 A1 | 11/2009 | Lubomirsky et al. |
| 2009/0283400 A1 | 11/2009 | Stowell et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0002210 A1 | 1/2010 | Hendel et al. |
| 2010/0052066 A1 | 3/2010 | Yu et al. |
| 2010/0059889 A1 | 3/2010 | Gosset et al. |
| 2010/0078315 A1 | 4/2010 | Stowell et al. |
| 2010/0078320 A1 | 4/2010 | Stowell |
| 2010/0081094 A1 | 4/2010 | Hasebe et al. |
| 2010/0081293 A1 | 4/2010 | Mallick et al. |
| 2010/0098884 A1 | 4/2010 | Balseanu et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1 | 9/2010 | Mizuno |
| 2010/0230052 A1 | 9/2010 | Iizuka |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0076420 A1 | 3/2011 | Stowell |
| 2011/0076422 A1 | 3/2011 | Stowell |
| 2011/0081782 A1 | 4/2011 | Liang et al. |
| 2011/0095007 A1 | 4/2011 | Jennings et al. |
| 2011/0097517 A1 | 4/2011 | Stowell et al. |
| 2011/0111137 A1* | 5/2011 | Liang et al. .......... 427/579 |
| 2011/0129616 A1 | 6/2011 | Ingle et al. |
| 2011/0136347 A1 | 6/2011 | Kovarsky et al. |
| 2011/0151677 A1 | 6/2011 | Wang et al. |
| 2011/0159213 A1 | 6/2011 | Cai et al. |
| 2011/0159703 A1* | 6/2011 | Liang et al. .......... 438/791 |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0212620 A1 | 9/2011 | Liang et al. |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0045631 A1 | 2/2012 | Stowell et al. |
| 2012/0073501 A1 | 3/2012 | Lubomirsky et al. |
| 2012/0074387 A1 | 3/2012 | King |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0122302 A1 | 5/2012 | Weidman et al. |
| 2012/0142192 A1 | 6/2012 | Li et al. |
| 2012/0145079 A1 | 6/2012 | Lubomirsky et al. |
| 2012/0161405 A1 | 6/2012 | Mohn et al. |
| 2012/0177846 A1 | 7/2012 | Li et al. |
| 2012/0180954 A1 | 7/2012 | Yang et al. |
| 2012/0190178 A1 | 7/2012 | Wang et al. |
| 2012/0193778 A1 | 8/2012 | Mawatari |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0292720 A1 | 11/2012 | Chen et al. |
| 2012/0309205 A1 | 12/2012 | Wang et al. |
| 2013/0062736 A1 | 3/2013 | Brighton et al. |
| 2013/0084711 A1 | 4/2013 | Liang et al. |
| 2013/0149462 A1 | 6/2013 | Liang et al. |
| 2013/0193578 A1 | 8/2013 | Yu et al. |

FOREIGN PATENT DOCUMENTS

| | | |
|---|---|---|
| EP | 0892083 A1 | 1/1999 |
| EP | 1095958 B1 | 5/2001 |
| EP | 1469509 A1 | 10/2004 |
| EP | 1717848 A | 11/2006 |
| EP | 1791161 A2 | 5/2007 |
| EP | 2022087 A2 | 5/2007 |
| JP | 57-75738 U | 10/1980 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 04-328825 A | 11/1992 |
| JP | 05-259156 | 10/1993 |
| JP | 05-304147 A | 11/1993 |
| JP | 06-077150 A | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-008014 A | 1/1997 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2003-179054 A | 6/2003 |
| JP | 2004-012315 | 1/2004 |
| JP | 2004-327639 | 11/2004 |
| JP | 2004-536444 A | 12/2004 |
| JP | 2005-142448 A | 6/2005 |
| JP | 2005-268396 A | 9/2005 |
| JP | 2005-302848 A | 10/2005 |
| JP | 2006-041539 A | 2/2006 |
| JP | 2006-210878 A | 8/2006 |
| JP | 2007-019067 A | 1/2007 |
| JP | 2007-191728 A | 8/2007 |
| JP | 2007-324154 A | 12/2007 |
| JP | 2008-159824 A | 7/2008 |
| JP | 2008/218684 A | 9/2008 |
| JP | 2011-220127 A | 11/2011 |
| KR | 10-1999-0010957 A | 2/1999 |
| KR | 0204793 B1 | 3/1999 |
| KR | 1020000011360 A | 2/2000 |
| KR | 1020020013383 A | 2/2002 |
| KR | 10-2004-0091978 A | 11/2004 |
| KR | 1020040104533 A | 12/2004 |
| KR | 10-2005-0003758 A | 1/2005 |
| KR | 10-2005-0072332 A | 7/2005 |
| KR | 10-2005-0085838 A | 8/2005 |
| KR | 10-2005-0094183 A | 9/2005 |
| KR | 1020060081350 A | 7/2006 |
| KR | 1020060103640 A | 10/2006 |
| KR | 10-2009-0011765 A | 2/2009 |
| KR | 10-2009-0121361 A | 11/2009 |

(56) References Cited

FOREIGN PATENT DOCUMENTS

| KR | 10-2009-0122860 A | 12/2009 |
|---|---|---|
| KR | 10-2010-0085743 A | 7/2010 |
| TW | 200514163 | 4/2005 |
| TW | 200707582 | 2/2007 |
| WO | 02/077320 A1 | 10/2002 |
| WO | 03/066933 A | 8/2003 |
| WO | 2005/078784 A | 8/2005 |
| WO | 2006/014034 A1 | 2/2006 |
| WO | 2007/040856 A2 | 4/2007 |
| WO | 2007/140376 A | 12/2007 |
| WO | 2007/140377 A | 12/2007 |
| WO | 2009/055340 A1 | 4/2009 |
| WO | 2010/080216 | 7/2010 |
| WO | 2012/145148 A2 | 10/2012 |
| WO | 2013/025336 | 2/2013 |

OTHER PUBLICATIONS

U.S. Appl. No. 12/070,660, filed Feb. 20, 2008, Stowell et al.
U.S. Appl. No. 12/077,375, filed Mar. 19, 2008, Stowell et al.
U.S. Appl. No. 12/115,717, filed May 6, 2008, Stowell et al.
U.S. Appl. No. 12/120,391, filed May 14, 2008, Stowell et al.
U.S. Appl. No. 12/238,664, filed Sep. 26, 2008, Stowell.
U.S. Appl. No. 12/238,685, filed Sep. 26, 2008, Stowell.
U.S. Appl. No. 12/833,473, filed Jul. 9, 2010, Stowell.
U.S. Appl. No. 12/833,524, filed Jul. 9, 2010, Stowell.
U.S. Appl. No. 12/833,571, filed Jul. 9, 2010, Stowell et al.
Alexandrov, et al., "Formation of Silicon Nitride Films by Remote Plasma-enhanced Chemical Vapour Deposition". Advanced Materials for Optics and Electronics, vol. 2, 301-312 (1993).
Aylett, B. J. et al., "Silicon-Nitrogen Compounds. Part V. Diphenylamino-derivatives of Silane," J. Chem. Soc. (A), Apr. 1969, pp. 636-638.
Aylett, B. J. et al., "Silicon-Nitrogen Compounds. Part VI.[1] The Preparation and Properties of Disilazane," J. Chem. Soc. (A), Apr. 1969, pp. 639-642.
Aylett, B. J. et al., "The Preparation and Some Properties of Disilylamine-Correspondence," Inorganic Chemistry, Jan. 1966, p. 167.
Beach, "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.
Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.
Burg, et al. "Silyl-Amino Boron Compounds," J. Amer. Chem. Soc., Jul. 1950, pp. 3103-3107, vol. 72.
Coltrin, M.E., et al., "Chemistry of AlGaN Particulate Formation," National Nuclear Security Administration, Physical, Chemical, & Nano Sciences Center, Research Briefs, 2005, pp. 42-43.
Davison, A et al., "The Raman Spectra of Manganese and Rhenium Carbonyl Hydrides and Some Related Species," Inorganic Chemistry, Apr. 1967, pp. 845-847, vol. 6 No. 4.
Dussarrat, C. et al., "Low Pressure Chemical Vapor Deposition of Silicon Nitride Using Mono—and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.
Franz, et al., "Conversion of silicon nitride into silicon dioxide through the influence of oxygen," Solid-State Electronics, Jun. 1971, pp. 449-505, vol. 14, Issue 6, Germany. Abstract Only.
Gulleri, G. et al., "Deposition Temperature Determination of HDPCVD Silicon Dioxide Films," 2005, Microelectronic Engineering, vol. 82, pp. 236-241.
International Search Report and Written Opinion of PCT/US2011/054635, mailed Jul. 9, 2012, 11 pages.
International Search Report and Written Opinion of PCT/US2011/054981, mailed May 9, 2012, 10 pages.
International Search Report and Written Opinion of PCT/US2011/054984, mailed May 11, 2012, 10 pages.
International Search Report and Written Opinion of PCT/US2011/066275, mailed Sep. 24, 2012, 9 pages.
International Search Report and Written Opinion of PCT/US2011/066281, mailed Jul. 19, 2012, 10 pages.
International Search Report and Written Opinion of PCT/US2011/066601, mailed Jul. 20, 2012, 10 pages.
International Search Report and Written Opinion of PCT/US2012/026786, mailed Jan. 2, 2013, 7 pages.
International Search Report and Written Opinion of PCT/US2012/044679, mailed Jan. 10, 2013, 9 pages.
International Search Report and Written Opinion of PCT/US2012/053999, mailed Feb. 27, 2013, 12 pages.
International Search Report and Written Opinion of PCT/US2012/031640 mailed Oct. 18, 2012, 10 pages.
International Search Report and Written Opinion of PCT/US2012/039629, mailed Dec. 26, 2012, 6 pages.
International Search Report and Written Opinion of PCT/US2012/059400, mailed Mar. 26, 2013, 11 pages.
International Search Report and Written Opinion of PCT/US2012/065086, mailed Mar. 25, 2013, 10 pages.
International Search Report and Written Opinion of PCT/US2013/050906, mailed Jan. 13, 2014, 10 pages.
Kang, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, 187 pages.
Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.
Loboda, M.J., et al., "Chemical influence of inert gas on the thin film stress in plasma-enhanced chemical vapor deposited a—SiN:H films". Journal of Materials Research, vol. 11, No. 2, Feb. 1996, pp. 391-398.
Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.
Norman, et al., "Reaction of Silylphosphine with Ammonia," Inorganic Chemistry, Jun. 1979, pp. 1594-1597, vol. 18 No. 6.
Search Report mailed Sep. 4, 2012, European Application No. 07811964, now patent No. 2022087, 8 pages.
Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.
Tripp, et al., "The Anodic Oxidation of Silicon Nitride Films on Silicon," Journal of the Electrochemical Society, 1970, pp. 157-159, 117(2).
Tsu, D. V. et al., "Silicon Nitride and Silicon Diimide Grown by Remote Plasma Enhanced Chemical Vapor Deposition", Journal of Vacuum Science and Technology: Part a, AVS/AIP, Melville, NY, US, vol. 4, No. 3, Part 01, May 1, 1986, pp. 480-485.
Usenko, et al., "Silicon Nitride Surface Conversion into Oxide to Enable Hydrophilic Bonding," ECS Meeting Abstracts, 2010, 1 page, Abstract #1716, 218th ECS Meeting.
Wang Li et al., "Properties of Hydrogenated Amorphous Silicon Caarbide Films Irradiated by Excimer Pulse Laser," 1998.
Ward, L. G. L. et al., "The Preparation and Properties of Bis-Disilanyl Sulphide and *Tris*-Disilanylamine," J. Inorg. Nucl. Chem., Dec. 1961, pp. 287-293, vol. 21, Pergamon Press Ltd., Northern Ireland.
Ward, Laird G. L., "Bromosilane, Iodosilane, and Trisilylamine," Inorganic Syntheses, 1968, pp. 159-170, vol. 11.
Ying-Yu et al., "Preparation of SiC Thin Film Using Organosilicon by Remote Plasma CVD Method," 1999.
Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.

(56) References Cited

OTHER PUBLICATIONS

Abraham, Tom, "Reactive Facet Tapering of Plasma Oxide for Multilevel Interconnect Applications," V-MIC Conference, IEEE, pp. 115-121, Jun. 15-16, 1987.
Agarwal et al., "Challenges in Integrating the High-K Gate Dielectric Film to the Conventional CMOS Process Flow," Mat. Sec. Soc. Sump. Proc. vol. 670 (2001).
Alonso, J.C. et al., "Fluorinated-chlorinated SiO2 films prepared at low-temperature by remote plasma-enhanced chemical vapor deposition using mixtures of SiF4 and SiF14," JVST V. 19, No. 2 Mar. 2001, pp. 507-514; XP012005495 ISSN: 0734-2101.
Alonso, J.C. et al., "High rate—low temperature deposition of silicon dioxide films by remote plasma enhanced chemical vapor deposition using silicon tetrachloride." Journal of Vacuum Science & Technology A: Vacuum, Surfaces, and Films, Nov. 1995, vol. 13, Issue 6, pp. 2924-2929. [Abstract Only].
Applied Materials Website Printout: "SACVD (Sub-Atmospheric Chemical Vapor Deposition)" from www.appliedmaterials.com/products/sacvd.html, printed Jun. 20, 2003.
Author Unknown, "Ultrafine Zinc Oxide," Sumitomo Osaka Cement Co., Ltd., 2 pages, no date.
Author Unknown, "Zinc Oxide Profile," obtained on Oct. 15, 2007 from website http://www.mountainroseherbs.com/learn/zinc_oxide.php, Mar. 3, 2005, 2 pages.
Author Unknown, "Vortek Impulse™ Anneal," Vortek Industries Ltd., 2000 [retrieved on Nov. 3, 2008], 2 pages. Retrieved from: http://web.archive.org/web/20020207191545/http://vortek.com/semi.htm.
Baker, F. et al. "STI TEOS Densification for Furnaces and RTP Tools" 1999 IEEE/SEMI Advanced Semiconductor Manufacturing Conference, 1999, pp. 394-399.
Banerjee et al., "Characterization of CVD Deposited Amorphous Fluorocarbons for Low k Interlayer Dielectrics", 1 *Electrochem. Soc* vol. 146, 2219 (1999).
Bang et al. (Jan. 3, 2002). US Patent Application Publication US-2002-0000195 A1.
Bapin et al., "Deposition of SiO2 films from different organosilicon/O2 plasmas under continuous wave and pulsed modes", Surface and Coatings Technology, Jul. 2001, pp. 649-654.
Bar-Ilan et al., "A comparative study of sub-micron gap filling and planarization techniques", SPIE vol. 2636, Oct. 1995, 277-288.
Bedair, "Atomic Layer Epitaxy Deposition Processes," J. Vac. Sci. Technol. B., vol. 12, No. 1, Jan./Feb. 1994.
Boisse-Laporte, "New Type of plasma reactor for thin film deposition: magnetron plasma process assisted by microwaves to ionise sputter vapour," Surface and Coatings Technology, 2004, 179, 176-181.
Broomfield et al., "HDP Dielectric BEOL Gapfill: A Process for Manufacturing", IEEE/SEMI Advanced Semiconductor Manufacturing Conference 1996, pp. 255-258.
Chang, Chorng-Ping et al., "Frequency Effects And Properties Of Plasma Deposited Fluorinated Silicon Nitride," J. Vac. Sci. Technol. B., vol. 6, No. 2, pp. 524-532, Mar./Apr. 1988.
Charles, Christine, "Role of ions in SiO 2 deposition with pulsed and continuous helicon plasma", *Pure and Applied Chemistry*, 2002— vol. 74, No. 3, pp. 401-405, 2002. IUPAC 401.
Chen, K.X. et al., "ESCE Course of MOCVD Bubblers," no page numbers or date available, 2 pages.
Choi et al., "Stability of TIB2 as a Diffusion Barrier on Silicon," J. Electrochem. Soc., vol. 138, No. 10, Oct. 1991.
Choi et al., "The Effect of Annealing on Resistivity of Low Pressure Chemical Vapor Deposited Titanium Diboride," J. Appl. Phys. 69 (11), Jun. 1, 1991.
Conti et al., "Processing methods to fill High aspect ratio gaps without premature constriction," DUMIC Conference, Feb. 8-9, 1999, pp. 201-209.
Cruden et al., "Thermal Decomposition of Low-k Pulsed Plasma Fluorocarbon Films. I. Effects of Precursors and Substrate Temperature", *J. Electrochem. Soc.* vol. 146,4590 (1999).
Cruden et al., "Thermal Decomposition of Low-k Pulsed Plasma Fluorocarbon Films. II. Effect of Post-Deposition Annealing and Ambients"*J. Electrochem. Soc.* 146,4597 (1999).
Definitions of "furnace", Merriam-Webster Online, 2006.
Derbyshire, "Applications of Integrated Processing," Solid State Technology, Dec. 1994.
Dharmadhikari et al., "UV-assisted Processing for Advanced Dielectric Films," Solid State Technology, Mar. 2005, pp. 43-44, 46, 48.
Dickson, M. et al., "Radial uniformity of an external-coil ionized physical vapor deposition source," J. Vac. Sci. Technol. B 16(2), Mar./Apr. 1998, pp. 523-531.
Ehrlich, D. J. et al., "Submicrometer Patterning by Projected Excimer-Laser-Beam Induced Chemistry," J. Vac. Sci. Technol. B, vol. 3, No. 1, pp. 1-8, Jan./Feb. 1985.
Elers et al., "NbCI5 as a Precursor in Atomic Layer Epitaxy," Applied Surface Science 82/83 (1994) 468-474.
Erlat, Ahmet G., et al., "Morphology and gas barrier properties of thin SiOx coatings and polycarbonate: Correlations with plasma-enhanced chemical vapor deposition conditions," J. Mater. Res., vol. 15, No. 3, Mar. 2000, pp. 704-717.
Farsari, M. et al., "Fabrication of Three-Dimensional Structures by Three-Photon Polymerization," Optics Letters, vol. 30, No. 23, pp. 3180-3182, Dec. 1, 2005.
Fritze, m. et al., "High-Throughput Hybrid Optical Maskless Lithography: All-Optical 32-nm Node Imaging," Emerging Lithographic Technologies IX, edited by Scott Mackay, Proceedings of the SPIE, vol. 5751, (SPIE, Bellingham, WA, 2005), pp. 1058-1068.
Fujino, K. et al., "Dependence of Deposition Characteristics on Base Materials in TEOS and Ozone CVD At Atmospheric Pressure," J. Electrochem. Soc., vol. 138, No. 2, pp. 550-554, Feb. 1991.
Fukada, Takashi et al., "Preparation of SiOF Films With Low Dielectric Constant by ECR Plasma CVD," DUMIC Conference, ISMIC, pp. 43-49, Feb. 21-22, 1995.
Galiano, M. et al., "Stress-Temperature Behavior of Oxide Films Used for Intermetal Dielectric Applications," VMIC Conference, ISMIC, pp. 100-106, Jun. 9-10, 1992.
Gelbart, Dan et al., "UV Thermoresists: Sub 100nm Imaging Without Proximity Effects," SPIE, vol. 3676, pp. 786-793, Mar. 1999.
George et al., "Surface Chemistry for Atomic Layer Growth," J. Phys. Chem. 1996, 100, 13121-13131.
Goto, Hiroshi et al., "Atomic layer controlled deposition of silicon nitride with self-limiting mechanism," Applied Physics Letters, AIP, American Institute of Physics, Melville, NY, US vol. 68, No. 23, Jun. 3, 1996, pp. 3257-3259.
Haberland, K. et al., "MOVPE Growth of (Al, Ga) InP-Based Laser Structures Monitored by Real-Time Reflectance Anisotrophy Spectroscopy," Journal of Electronic Materials, vol. 29, No. 1, 2000, pp. 94-98.
Hayasaka, N. et al., "High-Quality and Low Dielectric Constant SiO2 CVD Using High Density Plasma," Dry Process Symposium, pp. 163-168, 1993.
Horiike et al., "High rate and highly selective SiO2 etching employing inductively coupled plasma and discussion on reaction kinetics", JVST A 13(3) May/Jun. 1995, pp. 801-809.
Hwang et al., "Nanometer-Size a-PbO2-type TiO2 in Garnet: A Thermobarometer for Ultrahigh-Pressure Metamorphism," Science vol. 288 (Apr. 14, 2000).
Iijima, Yukio et al., "Highly Selective SiO2 Etch Employing Inductively Coupled Hydro-Fluorocarbon Plasma Chemistry for Self Aligned Contact Etch", Jpn. J. Appl. Phys., vol. 36, Part 1, No. 9A, Sep. 1997, pp. 5498-5501.
Imai et al., a Novel Atomic Layer Epitaxy Method of Silicon, Jpn. J. Appl. Phys., vol. 30, No. 12B, Dec. 1991, pp. 3646-3651.
International Search Report and Written Opinion of PCT/US2012/028310, mailed Oct. 18, 2012, 8 pages.
Jeong et al., "Growth and Characterization of Aluminum Oxide Al2O3 Thin Films by Plasma-Assisted Atomic Layer Controlled Deposition," J. Korean Inst. Met. Mater., vol. 38, No. 10, Oct. 2000.
Jeong et al., "Plasma-Assisted Atomic Layer Growth of High-Quality Aluminum Oxide Thin Films," Jpn. J. Appl. Phys. 1, Regul. Pap. Short Notes, vol. 40, No. 1, Jan. 2001.

(56) References Cited

OTHER PUBLICATIONS

Kamins et al., "Kinetics of Selective Epitaxial Deposition of SiGe," Applied Physics Letters, American Institute of Physics, New York, US, vol. 61, No. 6, Aug. 10, 1992, pp. 669-671.

Kawazu, Satoru et al., "Effects of Oxygen Concentration and Annealing Sequence on Microstructure of Separation by Implanted Oxygen Wafer with High-Temperature Annealing," Japanese Journal of Applied Physics, vol. 30, No. 1, 1991, pp. 112-115, Publication Office Japanese Journal of Applied Physics, Tokyo, Japan.

Kim, Hwa-Mok, et al., "High-Brightness Light Emitting Diodes using Dislocation-Free Indium Gallium Nitride/Gallium Nitride Multiquantum-Well Nanorod Arrays," Nano Letters, vol. 4, No. 6, 2004, pp. 1059-1062.

Kuo, Yue, "Etch Mechanism in the Low Refractive Index Silicon Nitride Plasma-Enhanced Chemical Vapor Deposition Process," Appl. Phys. Lett., vol. 63, No. 2, pp. 144-146, Jul. 12, 1993.

Kwok, K. et al., "Surface Related Phenomena in Integrated PECVD/Ozone-TEOS SACVD Processes for Sub-Half Micron Gap Fill: Electrostatic Effects," J. Electrochem. Soc., vol. 141, No. 8, pp. 2172-2177, Aug. 1994.

Labelle et al., "Fourier Transform Infrared Spectroscopy of Effluents from Pulsed Plasmas of 1,I,2,2—Tetrafluoroethane, Hexafluoropropylene, and Difluoromethane", T. Vac. Sci. Techno!. A. 76, 3419 (1999).

Labelle et al., "Pulsed Plasma Enhanced Chemical Vapor Deposition from CH2F2, C2H2F4, and CHClF/"T. Vac. Sci. Techno!. A, 17, 445 (1999).

Lassig, Stephan E. et al., "Intermetal Dielectric Deposition by Electron Cyclotron Resonance Chemical Vapor Deposition (ECR CVD)," pp. cover and 1-21, no date.

Lau et al., "Solid-State NMR of Low Dielectric Constant Films from Pulsed Hydrofluorocarbon Plasmas", T. Electrochem. Soc. vol. 146, No. 2652 (1999).

Laxman, Ravi K., "Low e Dielectrics: CVD Fluorinated Silicon Dioxides," Semiconductor International, pp. 71, 72, 74, May 1995.

Lee et al., "Cyclic Technique for the Enhancement of Highly Oriented Diamond Film Growth," Thin Solid Films 303 (1997) 264-269.

Lee, B. et al., "Dielectric Planarization Techniques for Narrow Pitch Multilevel Interconnects," V-MIC Conference, IEEE, pp. 85-92, Jun. 15-16, 1987.

Li, Junling et al., "Modeling Studies of the Mechanisms in Biased ECR CVD," 3 pages, no date.

Lim et al., "Gap-fill Performance and Film properties of PMD Films for the 65 nm device Technology", IEEE International Symposium on Semiconductor Manufacturing, Sep. 30-Oct. 2, 2003, pp. 435-438.

Limb et al.,"Molecular Design of Fluorocarbon Film Architecture by Pulsed Plasma Enhanced and Pyrolytic Chemical Vapor Deposition", *Plasmas and Polymers* 4(1), 21 (1999).

Lin, Chih-Lang et al., "Velocimetry Microsensors Driven by Linearly Polarized Optical Tweezers," Optics Letters, vol. 31, No. 3, pp. 329-331, Feb. 1, 2006.

Liop et al., "Molecular orientation in plastic optical fibres," Jan. 14, 1994, Journal of Physics D: Applied Physics, 27, 25-28.

Lubben et al., "Mechanisms and Kinetics of Si Atomic-Layer Epitaxy on Si(001)2X1 from Si2H6," J. Vac. Sci. Technol. A 9 (6), Nov./Dec. 1991, 3003-3011.

Ma et al. "Investigation on processing of industrial set-up plasma enhanced chemical vapor deposition with pulsed d.c. power", *Surface and Coatings Technology*, vol. 131, No. 1, Sep. 2000, pp. 131-135(5).

Ma et al. "Parametric effects of residual stress in pulsed d.c. plasma enhanced CVD TiN coatings", *Surface & Coatings Technology*, vol. 142, 2001, pp. 1023-1027.

Machida, Katsuyuki et al., "SiO2 Planarization Technology With Biasing and Electron Cyclotron Resonance Plasma Deposition for Submicron Interconnections," J Vac. Sci. Technol. B, vol. 4, No. 4, pp. 818-821, Jul./Aug. 1986.

Masaka, Katsuyuki et al., "Single Step Gap Filling Technology for Subhalf Micron Metal Spacings on Plasma Enhanced TEOS/O2 Chemical Vapor Deposition System", Extened Abstracts of the 1993 International Conference on Solid State Devices and Materals, Makuhari, 1993, pp. 5110-512 (Applied Materials Japan Inc. Technology Center, 14-3 Shinzumi Narita, Chiba 286 Japan).

Matsuda, Tetsuo et al., "Dual Frequency Plasma CVD Fluorosilicate Glass Deposition for 0.25 um Interlevel Dielectrics," DUMIC Conference, ISMIC, pp. 22-28, Feb. 21-22, 1995.

Meeks, Ellen et al., "Modeling of SiO2 Deposition in High Density Plasma Reactors and Comparisons of Model Predictions With Experimental Measurements," J. Vac. Sci. Technol. A, vol. 16, No. 2, pp. 544-563, Mar./Apr. 1998.

Menon et al., "Loading Effect in SiGe Layers grown by Dichlorosilane and Silane-based epitaxy," Journal of Applied Physics, American Institute of Physics, New York, US, vol. 90, No. 9, Nov. 1, 2001, pp. 4805-4809.

Meyerson et al., "Experimental and chemical kinetic modeling study of silicon CVC from monosilane and disilane," Chemtronics, vol. 1, Dec. 1989, pp. 150-155.

Min et al., "Chemical Vapor Deposition of Ti-Si-N Films with Alternating Source Supply," Mat. Res. Soc. Symp. Proc. vol. 564, 1999.

Min et al., "Metal-Organic Atomic-Layer Deposition of Titanium-Silicon-Nitride Films," Applied Physics Letters, vol. 75, No. 11 (Sep. 11, 1999).

Moore, Darren L. et al., "Reaction of Hydrogen Peroxide with Organosilanes Under Chemical Vapour Deposition Conditions," Dalton (2000), (16), 2673-2677, 2000, XP002276265.

Musaka, Katsuyuki et al., "Single Step Gap Filling Technology for Subhalf Micron Metal Spacings on Plasma Enhanced TEOS/O2 Chemical Vapor Deposition System," Extended Abstracts of the International Conference on Solid State Devices and Materials, pp. 510-512, 1993.

Nag et al., "Comparative Evaluation of gap-fill dielectrics in shallow trench isolation for sub-0.25 micron Technologies" IEDM 1996, 841-844.

Pai, "High quality voids free oxide deposition", Materials Chemistry and Physics, 44, 1996, pp. 1-8.

Pang, S. W. et al., "Aluminum Oxides As Imaging Materials for 193-nm Excimer Laser Lithography," J. Vac. Sci. Technol. B., vol. 7, No. 6, pp. 1624-1628, Nov./Dec. 1989.

Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.

Paranjpe et al., "Atomic Layer Deposition of AIO for Thin Film Head Gap Applications," J. Electrochem. Soc., vol. 148, No. 9, Sep. 2001.

Patil et al., "Deposition of Silicon Films in Presence of Nitrogen Plasma Feasibility Study," Bulletin of Materials Science Indian Acad. Sci. India, vol. 25, No. 5, Oct. 2002, pp. 399-402.

PCT International Search Report and Written Opinion mailed Dec. 30, 2010; International Application No. PCT/US2010/038713, 10 pages.

Pedrow, "Deposition of Plasma-Polymerized Acetylene by an Intense Pulsed RF Plasma Source", *IEEE Transactions on Plasma Science*, vol. 18, No. 6, Dec. 1990.

Peters, "Choices and challenges for shallow trench isolation", Semiconductor International, Apr. 1999, pp. 69-76.

Poonawala, Amyn et al., "ILT for Double Exposure Lithography With Conventional and Novel Materials," Proc. Of SPIE, vol. 6520, pp. 65202Q-1-65202Q-14, 2007.

Qian, L. Q. et al., "High Density Plasma Deposition and Deep Submicron Gap Fill With Low Dielectric Constant SiOF Films," DUMIC Conference, ISMIC, pp. 50-56, 1995.

Ritala et al., "Atomic Layer Deposition of Oxide Thin Films With Metal Alkoxides as Oxygen Sources," Science vol. 288, Apr. 14, 2000.

Robles, S. et al., "Effects of RF Frequency and Deposition Rates on the Moisture Resistance of PECVD TEOS-Based Oxide Films," ECS Extended Abstracts, vol. 92, No. 1, pp. 215-216, May 1992.

Romanelli, Alex, Semiconductor International website article: AMD Details 45nm Technology, at www.e-insite.net/semiconductor/; Jun. 12, 2003.

Rothschild, M. et al., "A Review of Excimer Laser Projection Lithography," J. Vac. Sci. Technol. B, vol. 6, No. 1, pp. 1-17, Jan./Feb. 1988.

(56) References Cited

OTHER PUBLICATIONS

Saito et al., "A Study of Low Temperature Formation of Stress-Free Silicon Nitride Films," Record of Electrical and Communication Engineering Converzione Tohoku University, Tokuku Japan, vol. 72, No. 1, Nov. 2003, pp. 302-303.

Sedgwick et al., "Selective SiGe and Heavily As doped Si deposited at low temperature by atmospheric pressure chemical vapor deposition," Journal of Vacuum Science and Technology: Part B, American Institute of Physics, New York, US, vol. 11, No. 3, May 1, 1993, pp. 1124-1128.

Shapiro, M. J. et al., "Dual Frequency Plasma CVD Fluorosilicate Glass Water Absorption and Stability," DUMIC Conference, ISMIC, pp. 118-123, Feb. 21-22, 1995.

Shimoda, et al., "Chemical Vapor Deposition of a Silicon Nitride Layer with an Excellent Interface by NH3 Plasma Treatment," Applied Physics Letters, 52(13);1068-1070 (1988).

Smith, "Mechanism of $SiN_xH_y$ deposition from $N_2$—$SiH_4$ plasma" *Journal of Vacuum Science & Technology B: Microelectronics and Nanometer Structures*—May 1990—vol. 8, Issue 3, pp. 551-557.

Stringfellow, G.B. et al., "High Brightness Light-Emitting Diodes", Semiconductors and Semimetals, vol. 48, Academic Press, San Diego, 1997, pp. 97-107.

Suda et al., "Adsorption and Thermal Dissociation of Disilane (Si2H6) on Si(100)2X1," J. Vac. Sci. Technol. A8 (1), Jan./Feb. 1990, 61-67.

Takahashi et al., "The Effect of Gas-phase additives C2H4, C2H6 and C2H2 on SiH4/O2 chemical vapor deposition". Journal of the Electrochemical Society, 143 (4) Apr. 1996, pp. 1355-1361.

Takeishi et al., "Fluorocarbon films deposited by PECVD with high thermal resistance and low dielectric constants." DUMIC 1996, pp. 71-77.

Takeishi et al., "Stabilizing Dielectric Constants on Fluorine-Doped_SiO2 Films by N2O-Plasma Annealing," DUMIC Conf. 1995 ISMIC, Executive Summary and Extended Abstract, Feb. 21-22, 1995, pp. 257-259.

Tomar, V.K., et al., "Depositions and characterization of SiOn using HMDS for Photonics applications," abstract, Feb. 2007, obtained on Oct. 16, 2007 from website http://www.iop.org/EJ/abstract/0268-1242/22/2/008, 2 pages.

Uchino et al., "A Raised Source/Drain Technology Using In-situ P-doped SiGe and B-doped Si for 0.1 CMOS ULSis," Electron Devices Meeting, 1997, Technical Digest, International Washington, DC, USA, Dec. 7-10, 1991, New York, NY, USA, IEEE, US, Dec. 7, 1997, pp. 479-482.

Usami, Takashi et al., "Low Dielectric Constant Interlayer Using Fluorine-Doped Silicon Oxide," Jpn. J. Appl. Phys., vol. 33, Part 1, No. 1B, pp. 408-412, Jan. 1994.

V.Y. Vassiliev, et al., "Trends in void-free pre-metal CVD dielectrics", Solid State Technology, Mar. 2001, pp. 129-136.

Van den hove, Luc et al., "Lithography Options for the 32nm Half Pitch Node," imec, 50 pages, 2006.

Vassiliev, V. Y. et al., "Trends in Void-Free Pre-Metal CVD Dielectrics," Solid State Technology, pp. 129-130, 132, 134, 136, Mar. 2001.

Walsh, Michael E., "Nanostructuring Magnetic Thin Films Using Interference Lithography," Massachusetts Institute of Technology, 86 pages, Aug. 2000.

Walsh, Michael E., "On the Design of Lithographic Interferometers and Their Application," Massachusetts Institute of Technology, 300 pages, Sep. 2004.

Webster, John G., "Wiley Encyclopedia of Electrical and Electronics Engineering," vol. 6, pp. 565-566, 1999.

Wikipedia, "Microstrip", obtained online at http://en.wikipedia.org/wiki/Microstrip on Jan. 25, 2008, 5 pages.

Wikipedia, "Microwave", obtained online at http://en.wikipedia.org/wiki/Microwave on Dec. 13, 2007, 7 pages.

Wolf et al., "Silicon Processing for the VLSI Era," vol. 1, 2nd ed., p. 199, Lattice Press, Sunset Beanch, CA, 2000.

Yin, Xiaobo et al., "Near-Field Two-Photon Nanolithography Using An Apertureless Optical Probe," Applied Physics Letters, vol. 81, No. 19, pp. 3663-3665, Nov. 4, 2002.

Yota et al., "Advanced passivation layer using high-density plasma CVD oxide for 0.25 micron CMOS Technology" DUMIC, Feb. 16-17, 1998, pp. 185-192.

Yota et al., "Extendibility of ICP high-density plasma CVD for use as intermetal dielectric and passivation layers for 0.18 micron technology," DUMIC Feb. 8-9, 1999, pp. 71-82.

Yu, D. et al., "Step Coverage Study of Peteos Deposition for Intermetal Dielectric Applications," VMIC Conference, IEEE, pp. 166-172, Jun. 12-13, 1990.

Zajickova, "Deposition of Protective Coatings in RF Organosilicon Discharges," Jan. 31, 2007, Institute of Physics Publishing, pp. 123-132.

Zajickova, L. et al., "Deposition of protective coatings in rf organosilicon discharges," abstract, Jan. 2007, obtained on Oct. 16, 2007 on website http://www.iop.org.EJ/abstract/0963-0252/16/1/S14, 2 pages.

* cited by examiner

LOW SHRINKAGE DIELECTRIC FILMS

CROSS-REFERENCES TO RELATED APPLICATIONS

This application claims the benefit of U.S. Provisional Application No. 61/756,762, filed Jan. 25, 2013, entitled "Low Shrinkage Dielectric Films." The entire disclosure of which is incorporated herein by reference for all purposes.

TECHNICAL FIELD

The present technology relates to semiconductor processes and equipment. More specifically, the present technology relates to forming dielectric materials.

BACKGROUND

As integrated circuit chipmakers continue increasing the density of circuit elements on each chip, filling the gaps that separate those elements becomes more challenging. The increased circuit element density has necessitated shorter widths between adjacent elements. As the width of these gaps shrink faster than their height, the ratio of height to width (known as the aspect ratio) proportionally increases. It is more difficult to fill a tall and narrow gap (i.e., a high aspect ratio gap) with a uniform film of dielectric material than a shallow and wide gap (i.e., a low aspect ratio gap).

One commonly encountered difficulty with filling high aspect ratio gaps is the formation of voids. In high aspect ratio gaps, there is a tendency of the dielectric material filling the gap to deposit at a faster rate around the top end of the gap. Often the dielectric material will close the top before the gap has been completely filled, leaving a void. Even when the top of the gap does not close prematurely, the uneven growth rate of the dielectric film down the sidewalls of the gap can create a weak seam in the middle of the gapfill. These seams can later result in cracks that adversely affect the physical integrity and dielectric properties of the device.

One technique to avoid the formation of voids and weak seams in dielectric gapfills is to fill the gap at a lower deposition rate. Lower deposition rates can give the dielectric material more time to redistribute on the inside surfaces of the gap to reduce the chances of excessive topside growth. A lower deposition rate may also be the result of increased etching or sputtering that occur at the same time as the dielectric deposition. For example, in HDPCVD dielectric material at the top corners of the gap etch away faster than material on the sidewalls and bottom portion of the gap. This increases the chances that the topside of the gap will remain open so the sidewalls and bottom can completely fill with dielectric material. However, reducing the dielectric deposition rate also results in the deposition taking longer to complete. The longer deposition times decrease the rate at which substrate wafers are processed through the deposition chamber, resulting in a reduced efficiency for chamber.

Thus, there is a need for improved systems and methods for filling short-width, high aspect ratio gaps with a void free dielectric film. These and other problems are addressed by the systems and methods of the present invention.

SUMMARY

Methods of forming a dielectric layer on a substrate are described, and may include introducing a first precursor into a remote plasma region fluidly coupled with a substrate processing region of a substrate processing chamber A plasma may be formed in the remote plasma region to produce plasma effluents. The plasma effluents may be directed into the substrate processing region. A silicon-containing precursor may be introduced into the substrate processing region, and the silicon-containing precursor may include at least one silicon-silicon bond. The plasma effluents and silicon-containing precursor may be reacted in the processing region to form a silicon-based dielectric layer that is initially flowable when formed on the substrate.

The silicon-containing precursors may include at least two silicon-silicon bonds, and may include three or more. The first precursor may include one or more precursors selected from the group including ammonia, nitrogen, $H_2$, Ar, and He, and may include additional carrier gases or combinations of precursors as well. The plasma effluents and silicon-containing precursor may be introduced into the processing region through a showerhead configured to maintain separation of the precursors so that they do not contact each other until they enter the substrate processing region. The substrate may be maintained at a distance less than or at about 3 inches from the showerhead, and may be maintained closer or further away in disclosed embodiments. The substrate processing region may be plasma-free during the deposition process, and in alternative arrangements a direct plasma may be provided within the processing region.

The silicon-containing precursor may have the formula $Si_xH_y$, where x is greater than or equal to 2, and y is 2x+n or greater, where n is any number less than or equal to 2. The silicon-containing precursor may also be introduced into the processing region in a substantially vapor phase. The method for deposition may be performed at a temperature of less than or equal to about 30° C., and the pressure during the process may be less than or equal to about 5 Torr. The as-formed film produced by the described processes may have a density greater than or equal to about 1.4 g/cc.

The methods may also include stopping the introduction of the silicon-containing precursor after the silicon-based dielectric layer is formed. The plasma effluents may be continuously directed into the substrate processing region, however, in order to densify the formed dielectric layer. The methods may further include annealing the formed silicon-based dielectric layer, and during the anneal, the formed silicon-based dielectric layer may shrink by less than about 20%.

Methods are also described for forming a dielectric layer on a substrate in a substrate processing region of a processing chamber. The methods may include introducing a first precursor into a remote plasma region fluidly coupled with the substrate processing region while forming a plasma in the remote plasma region to produce plasma effluents. The methods may also include directing the plasma effluents into the substrate processing region, and introducing a silicon-containing precursor into the substrate processing region. The silicon-containing precursor may include at least one silicon-silicon bond in disclosed embodiments. The methods may also include reacting the plasma effluents and silicon-containing precursor in the substrate processing region to form a silicon-based dielectric layer that is initially flowable when formed on the substrate. The methods may further include curing the formed silicon-based dielectric layer with at least one additional precursor.

The at least one additional precursor utilized may include an oxygen-containing precursor, a nitrogen-containing precursor, or a carbon-containing precursor. The methods may also include directing the plasma effluents into the substrate processing region to densify the cured dielectric layer. The silicon-containing precursor utilized may have the formula $Si_xH_y$, where x is greater than or equal to 2, and y is 2x+n or greater, where n is any number less than or equal to 2, and where the silicon-containing precursor is introduced into the processing region in a substantially vapor phase. The precursors introduced into the processing chamber to form the silicon-based dielectric layer may include one or more inert precursors and a silicon-containing precursor having silicon-silicon and silicon-hydrogen containing bonds. The methods may also include the step of annealing the formed silicon-based dielectric layer. When performed, the annealing may shrink the formed dielectric layer by less than about 20% during the annealing.

Such technology may provide numerous benefits over conventional techniques. For example, the deposition processes disclosed may produce denser and higher quality films. As such, film shrinkage may be reduced or prevented during annealing or post-formation operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
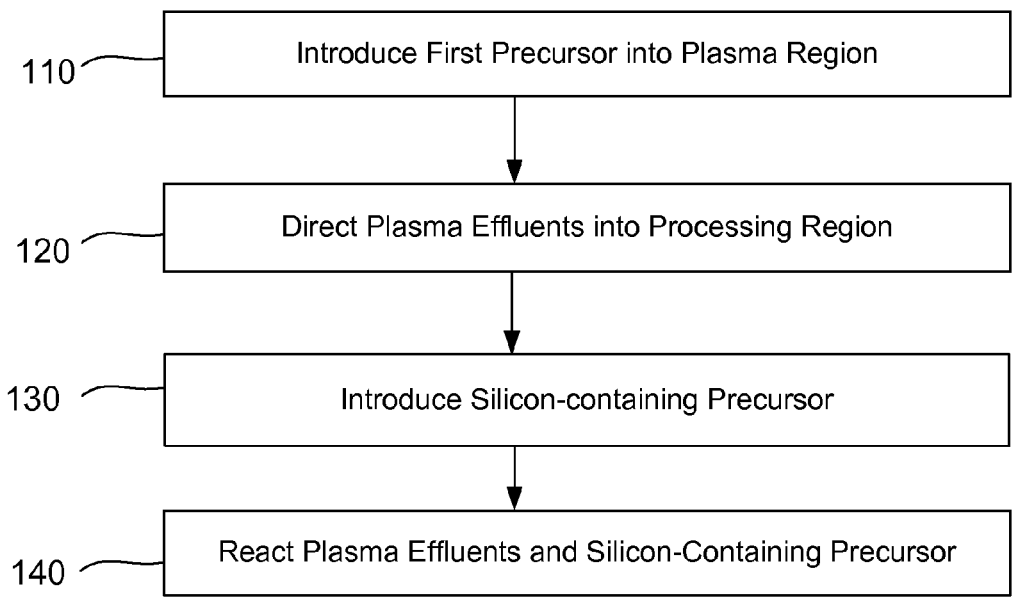
FIG. 1 shows a flow chart of a process for forming a dielectric film according to disclosed embodiments.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved processes and chemistry profiles for depositing silicon-based materials on substrates. While conventional processes may deposit films of similar materials, the films may suffer from reduced quality and density. Accordingly, when lower quality films are densified to produce a higher quality film, film shrinkage may occur that may have an adverse effect on the underlying device. For example, as device geometries are reduced, the silicon or device base may have thinner wall profiles. When a film is deposited within the structures and densified, the shrinking film may exert stress on the underlying structures that can deform the patterning. The present technology, however, may form flowable films that fundamentally shrink less than conventional films. In so doing, more intricate patterns can be covered. For example, trenches within the device may have very high aspect ratios, such as having a height:width ratio greater than or about 5:1, 8:1, 10:1, etc. or more, and as such a flowable dielectric film may be required to provide a bottom-up fill profile. If these films also shrink less when densified, less stress is exerted on the underlying structure, and overall process quality may be improved.

Methods of forming a dielectric layer on a substrate are described, and may include introducing a first precursor into a remote plasma region fluidly coupled with a substrate processing region of a substrate processing chamber A plasma may be formed in the remote plasma region to produce plasma effluents. The plasma effluents may be directed into the substrate processing region. A silicon-containing precursor may be introduced into the substrate processing region, and the silicon-containing precursor may include at least one silicon-silicon bond. The plasma effluents and silicon-containing precursor may be reacted in the processing region to form a silicon-based dielectric layer that is initially flowable when formed on the substrate.

Precursors used in deposition of silicon-based films may include a variety of additional molecules that affect the quality of the deposited film. For example, the presence of hydroxyl groups may increase the flowability of a deposited film. However, it may be desirable to remove these groups in the final film to produce higher quality films. The removal of these groups, or the substitution with other materials including oxygen, nitrogen, and carbon, for example, may reduce the overall density of the deposited or formed film. Accordingly, when later processing steps used to densify the film are performed, the film may shrink, which may produce unwanted stresses on the underlying structure. The inventors have advantageously determined that by reducing the inclusion of materials beyond silicon in the utilized precursors, the resulting film may have improved quality and may have reduced shrinking as compared to conventional films based on more varied precursor groups.

In order to better understand and appreciate the invention, reference is now made to FIG. 1, which shows a flow chart of a process for forming a dielectric film according to disclosed embodiments. Prior to the first operation, a substrate may be delivered into a process chamber, such as those described below. The substrate may be previously patterned or relatively clean. Various front end processing may have been performed including the formation of gates, vias, trenches, and other structures. These structures may be on the nanometer scale, and for example, trenches or gaps that require filling may have widths of less than about 100 nm, and may alternatively be less than or about 75 nm, 50 nm, 40 nm, 30 nm, 25 nm, 20 nm, 10 nm, etc. or less. The patterned substrate may then be delivered to a substrate processing region for deposition of a dielectric material. In disclosed embodiments, the substrate may already be located in the processing region if a previous operation was performed in the same chamber in which the deposition process is to occur. At operation 110, a first precursor may be introduced into a plasma region of the processing chamber that is separate or removed from the processing region of the chamber in which the substrate resides. The first precursor may include one of several precursor materials. For example, the first precursor may be one or more inert gases including argon, helium, nitrogen, etc. Additional gases may alternatively or additionally be used, and may include ammonia ($NH_3$), hydrogen, or nitrogen and/or hydrogen-containing gases. In disclosed embodiments, the first precursor may exclusively include inert gases, and in an exemplary process argon or helium is delivered to the plasma region.

The separate plasma region may be referred to as a remote plasma region herein and may be within a distinct module separate from the processing chamber, or as a compartment within the processing chamber. A plasma may be formed within the remote plasma region thereby generating plasma effluents from the first precursor. At operation 120, the generated plasma effluents are directed into the substrate processing region. This may be effected in a number of ways, including with a pressure differential, generated electric field, or some other known mechanism for directing the flow of ions and/or electrons into the processing region. Before, after, or concurrently with operation 120, a silicon-containing precursor may be introduced into the substrate processing region. In disclosed embodiments, the silicon-containing precursor includes at least one silicon-silicon bond.

The plasma effluents and silicon-containing precursor may be reacted in the substrate processing region to form a silicon based dielectric layer on the substrate. The formed material may be initially flowable when formed or when deposited initially, which may allow the material to flow down into trenches to fill defined patterns on the substrate. The dielectric material may be based on reactions between the plasma species and the silicon-containing precursor. The precursors may begin reacting directly upon contacting one another, and accordingly the precursors may be separated until entering the substrate processing region. Such separation may be performed by components such as a dual-channel showerhead as described further below. The showerhead may be configured to maintain separation of the precursors so as to prevent the precursors from contacting one another until they enter or are delivered into the substrate processing region. Previous technologies may have relied on the inclusion of water or hydroxyl groups in the as deposited film to potentially impart the flowability of the film. As previously stated, though, these groups may produce weaker films that may shrink unacceptably upon densification. The present technology, however, utilizes a variety of parameters that may synergistically allow flowability to occur.

Without being bound to a particular theory, the number of silicon-silicon bonds in the deposited film may directly correspond to the amount of shrinking of the produced film. For example, the more silicon-silicon bonds in the film, the less shrinking may occur as a result of densification because less additional polymerization may be imparted along with less removal of unwanted species. Such as when a silicon oxide film is being formed, after the initial deposition, the formed film may be oxidized or reacted with additional material so as to incorporate oxygen into the polymer matrix, and remove residual materials such as hydrogen, nitrogen, carbon, etc. The more materials that are removed from the film may leave pores within the film that are removed during densification, such as annealing. The removal of these pores may compress the film imparting stress along surfaces contacted by the film. These stresses may overcome a threshold that allows the structure to deform, which may destroy the underlying structure. Accordingly, the present technology may utilize silicon-containing precursors that maximize the number of silicon-silicon bonds, and minimize additional molecular bonding. In this way, less material may need to be removed during curing or other operations, which may reduce the amount of shrinking of the final film.

In disclosed embodiments, the technology may utilize silanes and polysilanes as the silicon-containing precursor. These materials may include or exclusively consist of silicon-silicon and silicon-hydrogen bonds. Exemplary precursors may include at least one silicon-silicon bond, at least two silicon-silicon bonds, at least three silicon-silicon bonds, etc. For example, the precursors may be selected from any of the polysilane homologues beginning with disilane. The silicon-containing precursor may also be selected from a variety of isomers of the polysilanes. For example, if the silicon-containing precursor has five silicon atoms, the composition could include any of n-pentasilane, isopentasilane, neopentasilane, 2-silyltetrasilane, 2,2-disilyltrisilane, etc. The silicon-containing precursors may include cyclic forms or cyclosilanes, such as cyclohexasilane, for example. The polysilanes may also include any saturated or unsaturated compound such as silenes and silynes. The silicon-containing precursor may also be of a general formula such as $Si_xH_y$. X may be any number of two or greater up to infinity, and Y may be any number of two or greater up to infinity. For example, such a minimal formula would denote disilyne ($Si_2H_2$). Y may also be any factor based on X. For example, Y may be 2X, or 2X+N, where n=2, 0, −2, −4, −6, etc., or N may be any number less than or equal to 2. Exemplary silanes used in the technology can include disilane, tetrasilane, cyclohexasilane, etc.

The vapor pressure of many of these disclosed materials is such that the materials may be in a substantially liquid phase under many operating conditions. Although the silicon-containing precursors may be used in liquid form in the disclosed technology, in embodiments the silicon-containing precursors may be introduced into the processing chamber in a vapor or substantially vapor form. However, this may require the use of additional components to ensure that the materials are introduced in a vapor form. Many different mechanisms may be employed to deliver vapor phase silicon-containing precursors. For example, vapor draw with or without a heated ampoule, a bubbler, or direct liquid injection may be utilized among a variety of other technology. However, depending on the precursor utilized, additional issues may occur. For example, if higher order silanes are delivered in liquid phase to an injection nozzle, the injection nozzle may be heated to deliver the material into the substrate processing region as a vapor. However, the vaporization temperature of higher order silanes and the polymerization temperature of higher order silanes may be relatively close, such that the technique may clog the nozzle. Additionally, a bubbler may utilize an inert gas in the delivery of the vapor, but also introduces the additional inert gas. In so doing, further mechanisms may be needed to ensure that an adequate flow of the actual silicon-containing precursor is delivered to provide adequate film formation rates. Higher order silicon-containing precursors or silanes have more silicon-silicon bonds which may lead to less shrinking of the films, but may additionally have very low vapor pressures which may require additional components or mechanisms to provide a vapor phase silicon-containing precursor to the substrate processing region.

Again without being bound to any particular theory, flowability of the dielectric material with the disclosed technology may be based on a combination of process parameters including the temperature and pressure of the process in relation to the silicon-containing precursor, plasma power used, and distance between the showerhead or mechanism delivering the precursors and the substrate on which the films are to be formed. During the processing, the substrate processing region may be relatively, substantially, or completely plasma-free during the deposition. Although the plasma effluents of the first precursor may be delivered into the substrate processing region, the plasma used to generate the effluents may be contained externally to the substrate processing region. The greatest amount of reactions may occur directly under the showerhead, or where the precursors initially interact. The plasma effluents may have had the least amount of time to recombine, and thus greater reactions between the precursors may occur. These gas phase reactions may be affected further by the material used. Silicon-silicon bonds may be weaker bonds than silicon-hydrogen, silicon-oxygen, and other silicon-based bonds. Accordingly, where these greater reactions occur, or where a higher plasma power is utilized, for the silicon-containing precursors of the present technology, a greater number of bonds may be broken. As a possible result, the dielectric material formed in this region may have reduced or no flowability when deposited on the substrate. As the distance of the substrate from the showerhead increases, the amount of interactions may be reduced slightly or more substantially. For example, potentially only one out of two or one out of three silicon-silicon bonds may be broken, and thus the polymerization may include longer chains of silicon groups, which may at least partially impart flowability to the deposited material.

Accordingly, the substrate may be maintained at a distance from the showerhead, or region where the interactions between the precursors begin, that is less than or about three inches. The substrate may be maintained at least 0.1 inches from the showerhead in disclosed embodiments. The substrate may also be maintained at a distance less than or about 2 inches, 1 inch, 0.9, 0.8, 0.7, 0.6, 0.5, 0.4, 0.3, 0.2, 0.1, or less inches, or be maintained between about 3 inches and about 0.01 inches, 2 and 0.1 inches, 1 and 0.2 inches, 0.8 and 0.2 inches, etc. The distance may also be determined in conjunction with the process parameters and silicon-containing precursor or precursors being used.

During the deposition process, the substrate may be maintained at or below about 400° C., and may be maintained at or below about 300° C., 200° C., 100° C., 80° C., 75° C., 50° C., 25° C., 10° C., 0° C., –10° C., –20° C., –30° C., or less, between about 30° C. and –30° C., etc. The processing chamber may be maintained at or below about 100 Torr during the processes, and may be maintained at or below about 50 Torr, 25 Torr, 15 Torr, 5 Torr, 1 Torr, 0.1 Torr, etc., or between about 0.1 mTorr and about 10 Torr. The temperature and pressure may also be set based at least partially on the vapor pressure of the silicon-containing precursor or precursors being used. As one non-limiting example, if tetrasilane is used as the silicon-containing precursor, and the chamber temperature is about –10° C., the vapor pressure of tetrasilane may be below about 3 Torr. As such, if the chamber pressure is greater than about 3 Torr, then condensation of the tetrasilane may occur. The interaction of the plasma effluents with the tetrasilane may also impart energy that overcomes the condensation point. Additionally, as the distance from the plasma source increases, and the plasma power decreases either or both from distance or actual generation power, the amount of silicon-silicon bond breaking may be reduced, which may allow longer polymer chains to be formed. The combination of improved polymerization, i.e. longer silicon-silicon chains, along with the benefit of operations at or near the condensation point of the precursors may at least partially impart flowability to the films. The process may also create longer silicon polymer chains with reduced additional material, which may reduce the amount of shrinking of the final film. The plasma source used in the technology may include plasma generated in the chamber, but remote from and fluidly coupled with the substrate processing region, or alternatively generated in a module separate from but fluidly coupled with the processing chamber. The plasma may be from any known or later developed technology, and may produce plasma power between about 0 and 2000 Watts. In disclosed embodiments, the plasma power may be less than or about 1000 Watts, or about 500, 300, 250, 200, 150, 100, 80, 60, 40, 20 Watts, etc. or less.

Utilizing the described processes, a synergistic combination may be produced where an amount of condensation and an amount of polymerization occur to produce flowable films from silicon-containing precursors that may only include silicon and hydrogen bonding. The resultant films may have flowability when initially formed on the substrate, but may be composed of mostly silicon-silicon and silicon-hydrogen bonds. These films that may have more silicon atoms in the matrix, and more silicon-silicon bonding in the deposited film, may shrink less than conventional films. Advantageously, the inventors have additionally determined that these films may have increased density as formed over conventional films. The as-deposited films may have a density greater than or equal to about 1.2 g/cc. The films may also have densities greater than or equal to about 1.3 g/cc, 1.4, 1.5, 1.6, 1.7, 1.8, 1.9, 2.0, 2.1, etc. or greater.

After an amount of dielectric material has been formed on the substrate, additional processes may be performed. One or more densifying operations may be performed to increase the quality of the dielectric material. In disclosed embodiments, once a determined amount of dielectric material has been formed, the introduction and flow of the silicon-containing precursor may be stopped. However, the plasma effluents may be continued to be produced and directed into the substrate processing region at the formed dielectric layer to densify the formed dielectric material. Additionally or alternatively, the formed silicon-based dielectric layer may be annealed to further densify the film. The annealing may be a dry anneal, such as with nitrogen, or a steam anneal that may occur at temperatures between about 200° C. and higher, above or about 400° C., above or about 900° C., etc. or greater. During the anneal, the amount or film shrinking may be less than conventional films. For example, the film may shrink by less than 50% during the anneal. Additionally, the films produced by the disclosed technology may shrink by less than or about 40%, 30%, 25%, 20%, 15%, 10%, 5%, 0%, –5%, –10%, etc. or less. In exemplary methods and processes, the inventors have determined that negative shrinking may occur. This negative shrinking may imply that the film expands during the processing.

Figure 2:
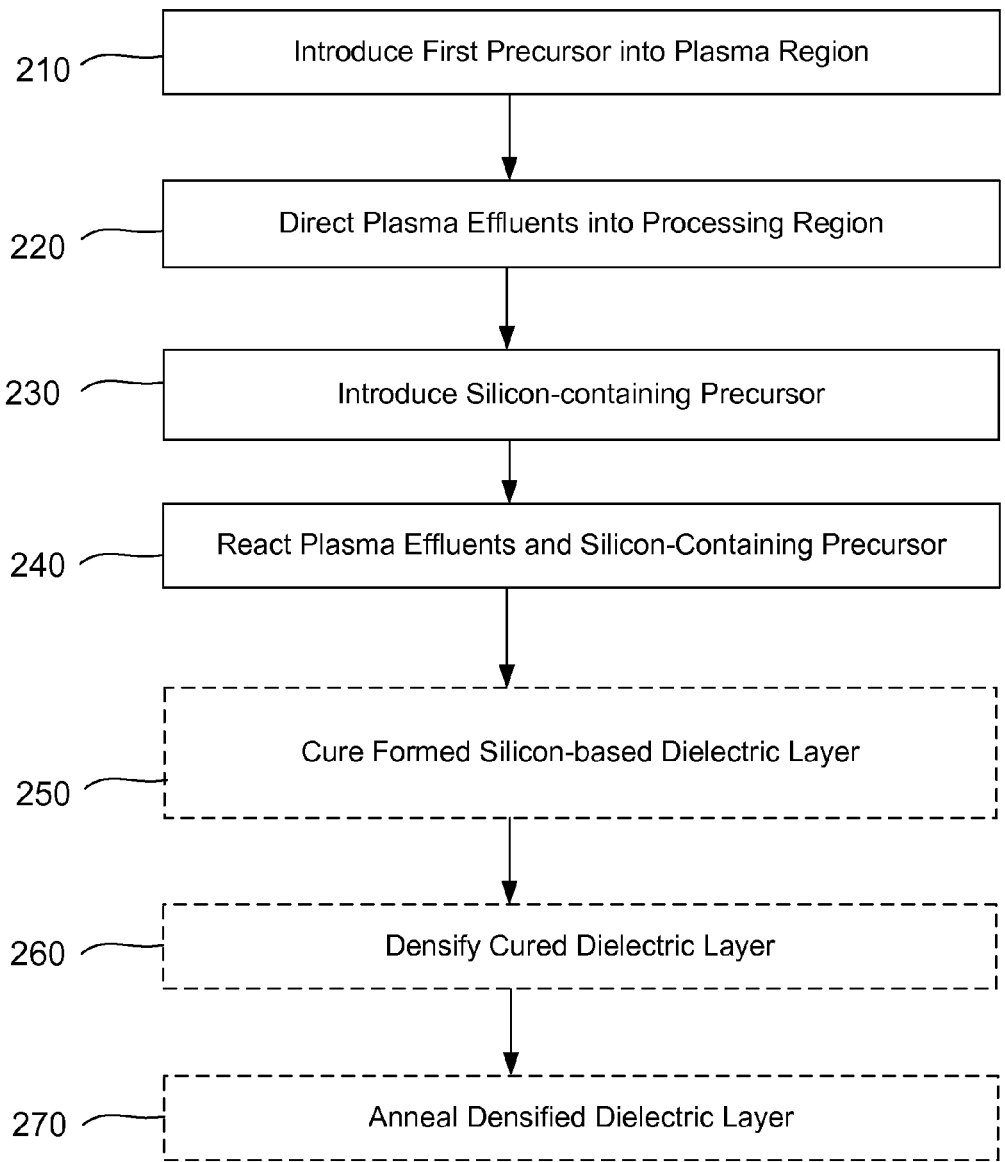
FIG. 2 shows another flow chart of a process for forming a dielectric film according to disclosed embodiments.

The above example process as described in conjunction with FIG. 1 may produce a substantially silicon based film, and may be used to produce polysilicon films of various structure and characteristics. The processes may be further adjusted to incorporate additional materials to produce oxides, nitrides, carbides, and other compositions useful in semiconductor processing. A further example of the disclosed technology incorporating additional materials is described with respect to FIG. 2. FIG. 2 shows another flow chart of a process for forming a dielectric film according to disclosed embodiments. The process may include similar operations as described with respect to FIG. 1. In disclosed embodiments, at operation 210 a first precursor may be introduced into a remote plasma region fluidly coupled with a substrate processing region while forming a plasma in the remote plasma region to produce plasma effluents. The first precursor may include one or more of any of the previously described precursors, and may consist exclusively of one or more inert precursors such as argon, helium, or nitrogen. At operation 220, the plasma effluents may be directed into the substrate processing region.

A silicon-containing precursor may be introduced into the substrate processing region at operation 230, and the silicon-containing precursor may have at least one silicon-silicon bond. The silicon-containing precursor may include one or more of any of the previously discussed precursors. For example, the silicon-containing precursor may have the formula $Si_xH_y$, where x may be greater than or equal to 2, and y is 2x+n or greater, and where n may be any number less than or equal to 2. Additionally, the silicon-containing precursor may be introduced into the processing region in a substantially vapor phase. In disclosed embodiments, the precursors introduced into the processing chamber to form the silicon-based dielectric layer may consist of one or more inert precursors and a silicon-containing precursor consisting of silicon-silicon and silicon-hydrogen containing bonds. For example, the first precursor may consist of argon or helium. At operation 240, the plasma effluents and silicon-containing precursors may be reacted to form a silicon-based dielectric layer on the substrate. These operations may be performed in any of the ways previously described. After the initial film has been formed, a curing operation may optionally be performed at operation 250 that cures the formed silicon-based dielectric layer with at least one additional precursor.

The additional precursor may include one or more of an oxygen-containing precursor, such as ozone, a nitrogen-containing precursor, or a carbon-containing precursor. The precursors may be introduced or utilized with or without the plasma effluents directed into the substrate processing region. The additional precursors may be used to additionally substitute material into the silicon-based dielectric material. For example, ozone or another oxygen-containing precursor may be used to provide oxygen that is incorporated into the silicon matrix to produce a silicon oxide film. This may help pack the formed matrix with additional material that may further help reduce shrinkage on annealing or densifying operations. A variety of films may be formed in this way, including oxides, nitrides, carbides, oxycarbides, oxynitrides, carbonitrides, etc. The additional precursors may be flowed after the formation of the silicon-based dielectric, near the end of the formation, and may be introduced with or without the silicon-containing precursors and/or the first precursor. The temperature and/or pressure of the chamber may be changed during the curing operation. For example, if the temperature of the film forming operation is less than 30° C., for example, the chamber temperature may be raised to above or about 30° C., 50° C., 100° C., 200° C., etc., or higher.

Subsequent to the optional introduction of additional precursor material, the cured or otherwise formed dielectric may be optionally densified at operation 260. The flow of the silicon-containing precursor and/or the additional precursor may be stopped, and then the flow of the first precursor may be performed, or continued in various embodiments. Plasma effluents developed from the first precursor may be directed into the substrate processing region to densify the formed or cured dielectric layer. In disclosed embodiments the densifying operation may be performed prior to the curing operation such that operation 260 is performed prior to operation 250. Additional operations may be performed optionally in the process including an anneal at operation 270. The formed, cured, and/or densified dielectric may be annealed as previously discussed to improve the final quality of the film. Further post-deposition treatments may be performed that may include one or more of a variety of operations including UV, e-beam, and other curing or annealing type operations. During the anneal, the silicon-based dielectric layer may shrink by less than or about 50%. The films produced by the disclosed technology may shrink by less than or about 40%, 30%, 25%, 20%, 15%, 10%, 5%, etc. or less. All optional operations may be performed in the same or a different chamber than the film forming or deposition operation. By maintaining the substrate in a chamber without breaking vacuum, moisture and other effects on the formed film may be reduced or prevented.

The technology also encompasses delivery of the silicon-containing precursor into the remote plasma region. Alternatively, the silicon-containing precursor may be activated by a direct plasma applied either in a remote region of the chamber, or alternatively in the processing region of the chamber, where the silicon-containing precursor is delivered to the area in which a plasma is developed. In disclosed embodiments, a silicon-containing precursor may be delivered into a processing region or a plasma region of a chamber and activated with a plasma, such as a type of plasma previously defined. The silicon-containing precursor may be delivered with additional fluids such as inert carriers that may include argon and may include hydrogen in disclosed embodiments as well. The process may be performed at a variety of the temperatures, pressures, and plasma powers previously described. For example, the plasma power applied directly may be less than 500 W, and may also be less than or about 300 W, 200 W, 100 W, 80 W, 70 W, 60 W, 50 W, etc. or less, and the temperatures may be below or about 100° C., and may also be less than or about 75° C., 50° C., 25° C., 15° C., 10° C., 5° C., 0° C., −5° C., etc. or less. Additionally, in this and other disclosed embodiments, the pedestal on which the substrate resides may be electrically biased. Biasing of the pedestal may provide an electrical field that may be used to direct radical species to the surface of the substrate.

The described processes synergistically utilize silicon-containing precursors having silicon-silicon bonding, temperature, pressure, plasma, and deposition distances to produce flowable films of improved qualities and reduced shrinking By accounting for the phase transition profiles of the silicon-containing precursors, the technology advantageously may remove nitrogen, carbon, water, hydroxyl groups, and other additional materials that may reduce the density, and increase the shrinking of the formed films. As would be understood, additional modifications to chamber parameters and plasma power may be used to further tune the deposition processes as may be required. Advantageously, tuning these processes may be performed without the need to break vacuum conditions or move the substrate to an additional chamber. This may reduce overall processing times and save costs over conventional techniques. Additional examples of deposition process parameters, chemistries, and components are disclosed in the course of describing an exemplary processing chamber and system below.

Exemplary Processing System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 3A:
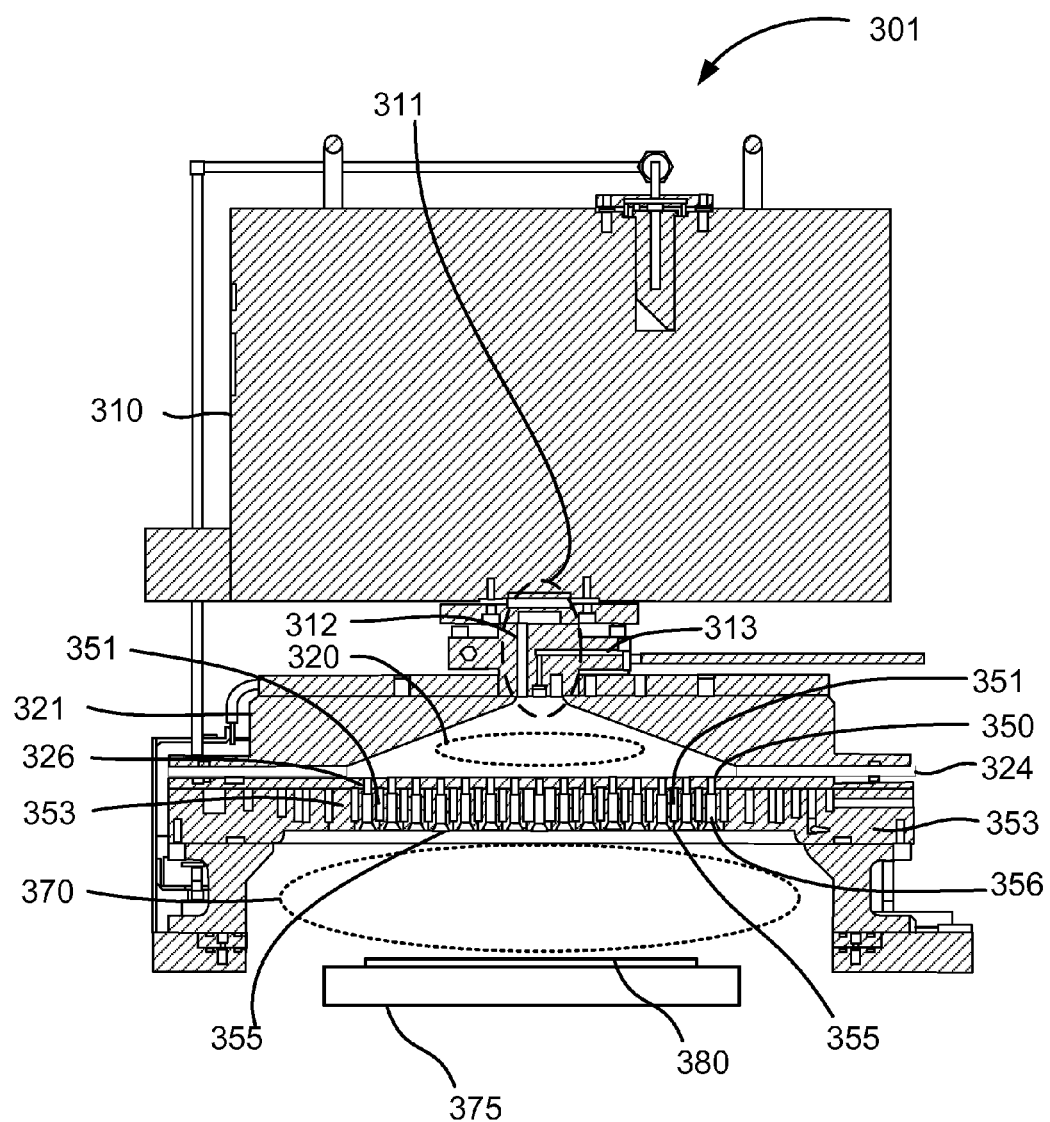
FIG. 3A shows a schematic cross-sectional view of a portion of a substrate processing chamber according to the disclosed technology.

FIG. 3A shows a schematic cross-sectional view of a portion of a substrate processing chamber 301 according to the disclosed technology. A remote plasma system (RPS) 310 may process a gas which then travels through a gas inlet assembly 311. Two distinct gas supply channels may be present within the gas inlet assembly 311. A first channel 312 may carry a gas that passes through the remote plasma system (RPS) 310, while a second channel 313 may bypass the RPS 310. The first channel 312 may be used for the process gas and the second channel 313 may be used for a treatment gas in disclosed embodiments. The lid or conductive top portion 321 and a perforated partition, such as showerhead 353, are shown with an insulating ring 324 disposed between, which may allow an AC potential to be applied to the lid 321 relative to showerhead 353. The process gas may travel through first channel 312 into chamber plasma region 320 and may be excited by a plasma in chamber plasma region 320 alone or in combination with RPS 310. The combination of chamber plasma region 320 and/or RPS 310 may be referred to as a remote plasma system herein. The perforated partition or showerhead 353 may separate chamber plasma region 320 from a substrate processing region 370 beneath showerhead 353. Showerhead 353 may allow a plasma present in chamber plasma region 320 to avoid directly exciting gases in substrate processing region 370, while still allowing excited species to travel from chamber plasma region 320 into substrate processing region 370.

Showerhead 353 may be positioned between chamber plasma region 320 and substrate processing region 370 and allow plasma effluents or excited derivatives of precursors or other gases created within chamber plasma region 320 to pass through a plurality of through-holes 356 that traverse the thickness of the plate or plates included in the showerhead. The showerhead 353 may also have one or more hollow volumes 351 that can be filled with a precursor in the form of a vapor or gas, such as a silicon-containing precursor, and pass through small holes 355 into substrate processing region 370, but not directly into chamber plasma region 320. Showerhead 353 may be thicker than the length of the smallest diameter 350 of the through-holes 356 in disclosed embodiments. In order to maintain a significant concentration of excited species penetrating from chamber plasma region 320 to substrate processing region 370, the length 326 of the smallest diameter 350 of the through-holes may be restricted by forming larger diameter portions of through-holes 356 part way through the showerhead 353. The length of the smallest diameter 350 of the through-holes 356 may be the same order of magnitude as the smallest diameter of the through-holes 356 or less in disclosed embodiments.

In the embodiment shown, showerhead 353 may distribute, via through-holes 356, process gases which contain a plasma vapor/gas such as argon, for example. Additionally, the showerhead 353 may distribute, via smaller holes 355, a silicon-containing precursor that is maintained separately from the plasma region 320. The process gas or gases and the silicon-containing precursor may be maintained fluidly separate via the showerhead 353 until the precursors separately enter the processing region 370. The precursors may contact one another once they enter the processing region and react to form a flowable dielectric material on a substrate 380.

In embodiments, the number of through-holes 356 may be between about 60 and about 2000. Through-holes 356 may have a variety of shapes but may be made round. The smallest diameter 350 of through-holes 356 may be between about 0.5 mm and about 20 mm or between about 1 mm and about 6mm in disclosed embodiments. There is also latitude in choosing the cross-sectional shape of through-holes, which may be made conical, cylindrical or a combination of the two shapes. The number of small holes 355 used to introduce a gas into substrate processing region 370 may be between about 100 and about 5000 or between about 500 and about 2000 in different embodiments. The diameter of the small holes 355 may be between about 0.1 mm and about 2 mm.

Figure 3B:
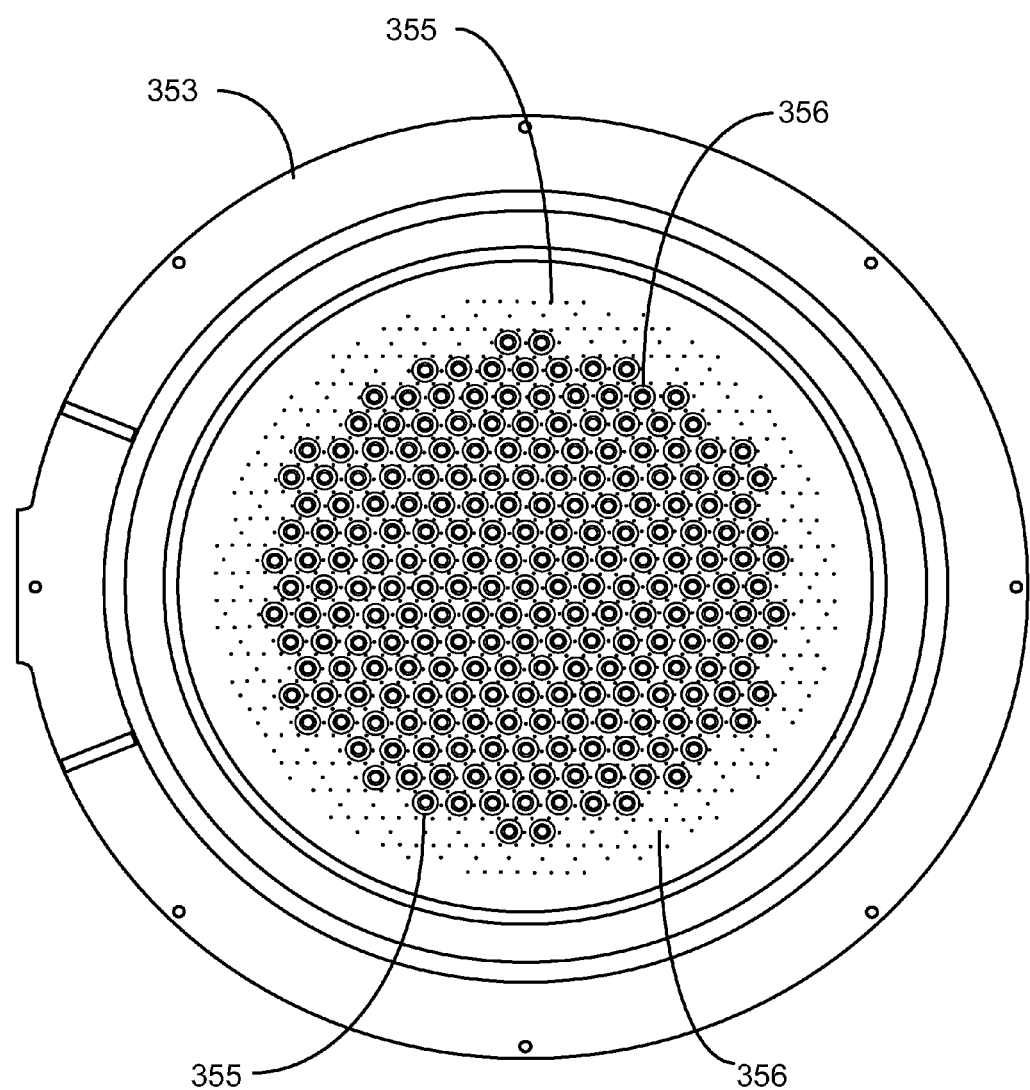
FIG. 3B shows a bottom plan view of a showerhead according to the disclosed technology.
Figure 4:
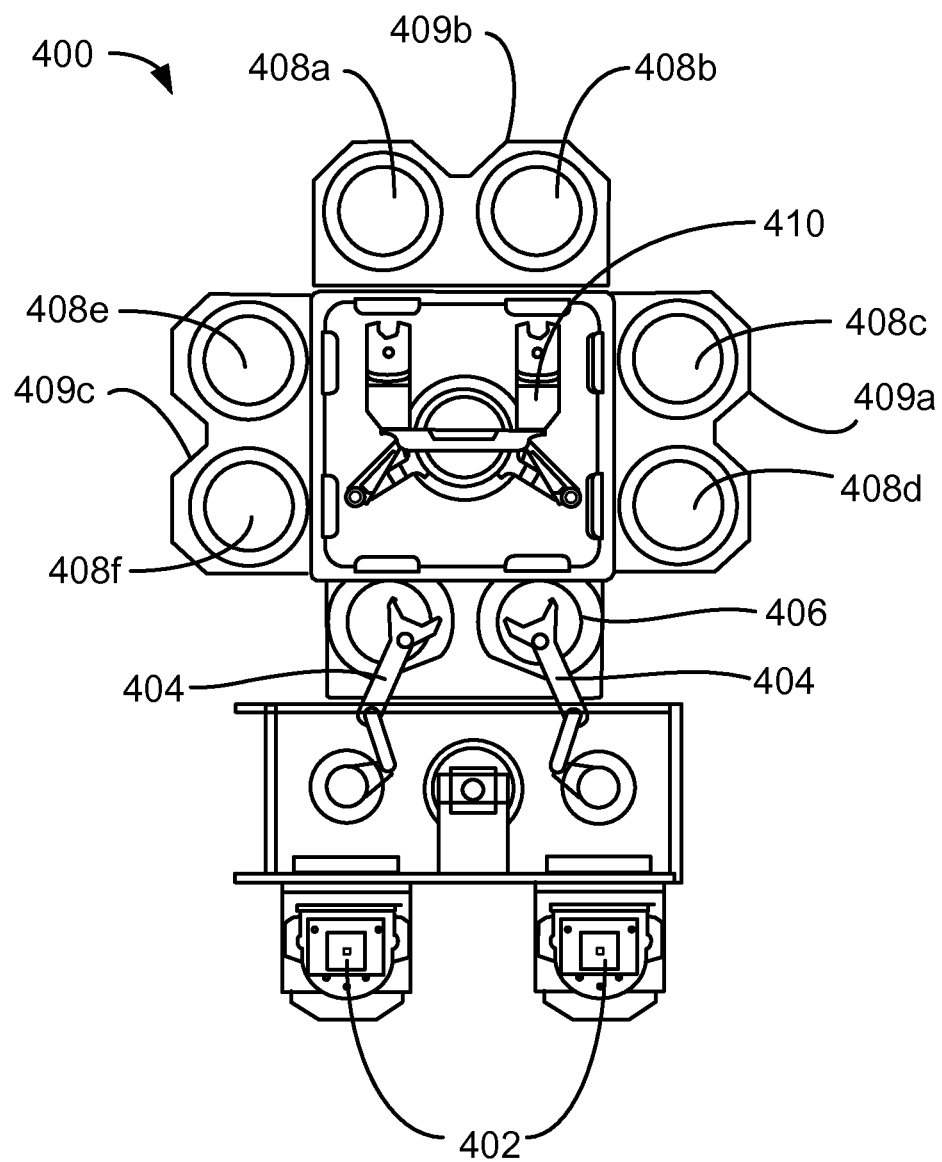
FIG. 4 shows a top plan view of an exemplary substrate processing system according to the disclosed technology.

FIG. 3B shows a bottom plan view of a showerhead 353 according to the disclosed technology. Showerhead 353 corresponds with the showerhead shown in FIG. 3A. Through-holes 356 are depicted with a larger inner-diameter (ID) on the bottom of showerhead 353 and a smaller ID at the top. Small holes 355 are distributed substantially evenly over the surface of the showerhead, even amongst the through-holes 356 which may help to provide more even mixing than other embodiments described herein.

An additional dual channel showerhead, as well as this processing system and chamber, are more fully described in patent application Ser. No. 13/251,714 filed on Oct. 3, 2011, which is hereby incorporated by reference for all purposes to the extent not inconsistent with the claimed features and description herein.

An exemplary film may be created on a substrate supported by a pedestal, such as pedestal 375 having a substrate 380 disposed thereon, within substrate processing region 370 when plasma effluents arriving through through-holes 356 in showerhead 353 combine with a silicon-containing precursor arriving through the small holes 355 originating from hollow volumes 351. Though substrate processing region 370 may be equipped to support a plasma for other processes such as curing, no plasma may be present during the growth or deposition of the exemplary films.

A plasma may be ignited either in chamber plasma region 320 above showerhead 353 or substrate processing region 370 below showerhead 353. Alternatively, no plasma may be formed in any portion of the chamber, and may be only formed in RPS unit 310. A plasma may be present in chamber plasma region 320 to produce the radical plasma effluents, such as from an inflow of one or more of argon, helium, hydrogen, or ammonia. An AC voltage typically in the radio frequency (RF) range is applied between the conductive top portion, such as lid 321, of the processing chamber and showerhead 353 to ignite a plasma in chamber plasma region 320 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 370 may be turned on during the formation of the dielectric layer or while cleaning the interior surfaces bordering substrate processing region 370. A plasma in substrate processing region 370 may be ignited by applying an AC voltage between showerhead 353 and the pedestal 375 or bottom of the chamber. A cleaning gas may be introduced into substrate processing region 370 while the plasma is present.

The pedestal 375 may be moveable, and may be configured to be raised or lowered in disclosed embodiments, and may similarly be configured to rotate. The pedestal 375 may have a heat exchange channel through which a heat exchange fluid flows to control the temperature of the substrate. This configuration allows the substrate temperature to be cooled or heated to maintain relatively low temperatures, such as from about 0° C. or lower up to about 200° C. or higher. The heat exchange fluid may comprise ethylene glycol, water, or some other fluid capable of introducing or removing heat from the system. The wafer support platter of the pedestal may also be resistively heated in order to achieve relatively high temperatures from about 200° C. or lower up to about 1100° C. or higher using an embedded resistive heating element. An outer portion of the heater element may run adjacent to a perimeter of the support platter, while an inner portion runs on the path of a concentric circle having a smaller radius. The resistive heating element may additionally be coiled through the platter to provide more uniform temperatures. The wiring to the heater element may pass through the stem of the pedestal.

The chamber plasma region or a region in an RPS may be referred to as a remote plasma region. In embodiments, the radical precursor, e.g. an argon precursor, may be created in the remote plasma region and travel into the substrate processing region to combine with the silicon-containing precursor. In embodiments, the silicon-containing precursor is excited only by the radical-argon precursor. Plasma power may essentially be applied only to the remote plasma region, in embodiments, to ensure that the radical-argon precursor provides the dominant excitation to the silicon-containing precursor.

In embodiments employing a chamber plasma region, the excited plasma effluents may be generated in a section of the substrate processing region partitioned from a deposition region. The deposition region, also known herein as the substrate processing region, may be where the plasma effluents mix and react with the silicon-containing precursor to deposit dielectric material on the substrate, e.g., a semiconductor wafer. The excited plasma effluents may also be accompanied by additional gases including other inert gases or ammonia, for example. The silicon-containing precursor may not pass through a plasma before entering the substrate plasma region, in embodiments. The substrate processing region may be described herein as "plasma-free" during the deposition of the dielectric material. "Plasma-free" does not necessarily mean the region is devoid of plasma. Ionized species and free electrons created within the plasma region may travel through pores or apertures in the partition or showerhead, but the silicon-containing precursor may not be substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region, or a remote plasma region, during the creation of the excited plasma effluents do not deviate from the scope of "plasma-free" as used herein.

Plasma power can be a variety of frequencies or a combination of multiple frequencies. In the exemplary processing system, the plasma may be provided by RF power delivered to lid 321 relative to showerhead 353. The RF power may be between about 10 watts and about 2000 watts, between about 100 watts and about 2000 watts, between about 200 watts and about 1500 watts, less than or about 100 Watts, or less than or about 500 watts in different embodiments. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled (CCP) or inductively-coupled (ICP) into the remote plasma region.

Substrate processing region 370 can be maintained at a variety of pressures during the flow of precursors, any carrier gases, and plasma effluents into substrate processing region 370. The pressure may be maintained between about 0.1 mTorr and about 100 Torr, between about 1 Torr and about 20 Torr, less than about 5 Torr, or less than about 3 Torr in different embodiments.

Embodiments of the deposition systems may be incorporated into larger fabrication systems for producing integrated circuit chips. FIG. 3 shows one such system 400 of deposition, etching, baking, and curing chambers according to disclosed embodiments. In the figure, a pair of front opening unified pods (FOUPs) 402 supply substrates of a variety of sizes that are received by robotic arms 404 and placed into a low pressure holding area 406 before being placed into one of the substrate processing chambers 408a-f. A second robotic arm 410 may be used to transport the substrate wafers from the holding area 406 to the substrate processing chambers 408a-f and back. Each substrate processing chamber 408a-f, can be outfitted to perform a number of substrate processing operations including the deposition processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 408a-f may include one or more system components for depositing, annealing, curing and/or etching a dielectric film on the substrate wafer. In one configuration, two pairs of the processing chambers, e.g., 408c-d and 408e-f, may be used to deposit dielectric material on the substrate, and the third pair of processing chambers, e.g., 408a-b, may be used to etch the deposited dielectric. In another configuration, all three pairs of chambers, e.g., 408a-f, may be configured to deposit, cure, and densify a dielectric film on the substrate. Any one or more of the processes described may be carried out in chamber(s) separated from the fabrication system shown in different embodiments.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or steps, but they do not preclude the presence or addition of one or more other features, integers, components, steps, acts, or groups.

What is claimed is:

1. A method of forming a dielectric layer on a substrate in a substrate processing region of a processing chamber, the method comprising:
   introducing a first precursor into a remote plasma region fluidly coupled with the substrate processing region while forming a plasma in the remote plasma region to produce plasma effluents;
   directing the plasma effluents into the substrate processing region;
   introducing a silicon-containing precursor into the substrate processing region, wherein the silicon-containing precursor includes at least one silicon-silicon bond; and
   reacting the plasma effluents and silicon-containing precursor in the substrate processing region to form a silicon-based dielectric layer that is initially flowable when formed on the substrate, wherein the processing chamber is maintained at a temperature from about 30° C. to about −30° C., and wherein the pressure within the processing chamber is maintained so the reacting operation occurs at or about the condensation point of the silicon-containing precursor.

2. The method of claim 1, wherein the silicon-containing precursor includes at least two silicon-silicon bonds.

3. The method of claim 1, wherein the first precursor includes one or more precursors selected from the group consisting of ammonia, nitrogen, $H_2$, Ar, and He.

4. The method of claim 1, wherein the plasma effluents and silicon-containing precursor are introduced into the processing region through a showerhead configured to maintain separation of the precursors so that they do not contact each other until they enter the substrate processing region.

5. The method of claim 4, wherein the substrate is maintained at a distance less than or at about 3 inches from the showerhead.

6. The method of claim 1, wherein the substrate processing region is plasma-free during the deposition process.

7. The method of claim 1, wherein the silicon-containing precursor has the formula $Si_xH_y$, wherein x is greater than or equal to 2, and y is 2x+n or greater, wherein n is any number less than or equal to 2, and wherein the silicon-containing precursor is introduced into the processing region in a substantially vapor phase.

8. The method of claim 1, wherein the method is performed at a temperature of less than or equal to about 30° C.

9. The method of claim 1, wherein the method is performed at a pressure of less than or equal to about 5 Torr.

10. The method of claim 1, whrerein the as-formed film has a density greater than or equal to about 1.4 g/cc.

11. The method of claim 1, further comprising stopping the introduction of the silicon-containing precursor after the silicon-based dielectric layer is formed, and continuing to direct the plasma effluents of the first precursor into the substrate processing region to densify the formed dielectric layer.

12. The method of claim 1, further comprising annealing the formed silicon-based dielectric layer.

13. The method of claim 12, wherein the formed silicon-based dielectric layer shrinks by less than about 20% during the annealing.

14. A method of forming a dielectric layer on a substrate in a substrate processing region of a processing chamber, the method comprising:
   introducing a first precursor into a remote plasma region fluidly coupled with the substrate processing region while forming a plasma in the remote plasma region to produce plasma effluents;
   directing the plasma effluents into the substrate processing region;
   introducing a silicon-containing precursor into the substrate processing region, wherein the silicon-containing precursor includes at least one silicon-silicon bond;
   reacting the plasma effluents and silicon-containing precursor in the substrate processing region to form a silicon-based dielectric layer that is initially flowable when formed on the substrate, wherein the processing chamber is maintained at a temperature from about 30° C. to about −30° C., and wherein the pressure within the processing chamber is maintained so the reacting operation occurs at or about the condensation point of the silicon-containing precursor; and
   curing the formed silicon-based dielectric layer with at least one additional precursor.

15. The method of claim 14, wherein the at least one additional precursor comprises an oxygen-containing precursor, a nitrogen-containing precursor, or a carbon-containing precursor.

16. The method of claim 14, further comprising directing the plasma effluents into the substrate processing region to densify the cured dielectric layer.

17. The method of claim 14, wherein the silicon-containing precursor has the formula $Si_xH_y$, wherein x is greater than or equal to 2, and y is 2x+n or greater, wherein n is any number less than or equal to 2, and wherein the silicon-containing precursor is introduced into the processing region in a substantially vapor phase.

18. The method of claim 14, wherein the precursors introduced into the processing chamber to form the silicon-based dielectric layer consist of one or more inert precursors and a silicon-containing precursor consisting of silicon-silicon and silicon-hydrogen containing bonds.

19. The method of claim 14, further comprising annealing the formed silicon-based dielectric layer.

20. The method of claim 14, wherein the formed silicon-based dielectric layer shrinks by less than about 20% during the annealing.

* * * * *